(12) United States Patent (10) Patent No.: US 10,991,762 B2
Kitagawa et al. (45) Date of Patent: Apr. 27, 2021

(54) MEMORY UNIT

(71) Applicant: SONY SEMICONDUCTOR SOLUTIONS CORPORATION, Kanagawa (JP)

(72) Inventors: Makoto Kitagawa, Kanagawa (JP); Yoshiyuki Shibahara, Tokyo (JP); Haruhiko Terada, Kanagawa (JP); Yotaro Mori, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 43 days.

(21) Appl. No.: 16/494,853

(22) PCT Filed: Mar. 5, 2018

(86) PCT No.: PCT/JP2018/008240
§ 371 (c)(1),
(2) Date: Sep. 17, 2019

(87) PCT Pub. No.: WO2018/180228
PCT Pub. Date: Oct. 4, 2018

(65) Prior Publication Data
US 2020/0286953 A1 Sep. 10, 2020

(30) Foreign Application Priority Data
Mar. 31, 2017 (JP) .............................. JP2017-071718

(51) Int. Cl.
*H01L 27/24* (2006.01)
*G11C 13/00* (2006.01)

(52) U.S. Cl.
CPC .......... *H01L 27/249* (2013.01); *G11C 13/003* (2013.01); *H01L 27/2436* (2013.01); *G11C 2213/71* (2013.01); *G11C 2213/79* (2013.01)

(58) Field of Classification Search
CPC . H01L 27/249; H01L 27/2436; H01L 27/105; H01L 21/8239; H01L 49/00; G01C 13/003
(Continued)

(56) References Cited

U.S. PATENT DOCUMENTS 9,455,268 B2 * 9/2016 Oh ...................... H01L 21/0274
2007/0252201 A1 * 11/2007 Kito ................... H01L 27/11573
257/331
(Continued)

FOREIGN PATENT DOCUMENTS

JP 2013-004778 1/2013
JP 2013-120618 6/2013
(Continued)

OTHER PUBLICATIONS

International Search Report prepared by the Japan Patent Office dated Apr. 13, 2018, for International Application No. PCT/JP2018/008240.

*Primary Examiner* — Dao H Nguyen
(74) *Attorney, Agent, or Firm* — Sheridan Ross P.C.

(57) ABSTRACT

In a memory unit according to an embodiment of the present disclosure, a memory cell array is configured, when, of a plurality of memory cells, multiple first memory cells whose corresponding fourth wiring line and first wiring line are different from one another are simultaneously accessed, to allow for simultaneous access to the multiple first memory cells, without allowing for simultaneous access to memory cells corresponding to the fourth wiring line shared by the first memory cells.

12 Claims, 23 Drawing Sheets

(58) Field of Classification Search
USPC ........ 257/4, 5, 314, 315, 326, 773, E27.081,
257/E27.103, E29.309, E45.002, E21.19,
257/E21.4, E21.645, E21.679; 438/268,
438/270, 585, 586, 703
See application file for complete search history.

(56) References Cited

U.S. PATENT DOCUMENTS

| | | | |
|---|---|---|---|
| 2011/0092038 A1* | 4/2011 | Choi | H01L 27/11556 |
| | | | 438/268 |
| 2011/0316063 A1* | 12/2011 | Tang | H01L 27/2454 |
| | | | 257/314 |
| 2012/0211823 A1* | 8/2012 | Lim | H01L 27/11565 |
| | | | 257/326 |
| 2013/0148400 A1 | 6/2013 | Murooka | |
| 2013/2439650 | 9/2013 | Nakal et al. | |
| 2013/0320652 A1 | 12/2013 | Strunk et al. | |
| 2014/0124850 A1* | 5/2014 | Tanaka | H01L 21/8221 |
| | | | 257/324 |
| 2014/0162420 A1* | 6/2014 | Oh | H01L 27/11582 |
| | | | 438/270 |
| 2016/0322376 A1* | 11/2016 | Lee | H01L 27/11582 |

FOREIGN PATENT DOCUMENTS

| | | |
|---|---|---|
| JP | 2013-197546 | 9/2013 |
| JP | 2015-170852 | 9/2015 |
| JP | 2016-167332 | 9/2016 |

* cited by examiner

MEMORY UNIT

CROSS REFERENCE TO RELATED APPLICATIONS

This application is a national stage application under 35 U.S.C. 371 and claims the benefit of PCT Application No. PCT/JP2018/008240 having an international filing date of 5 Mar. 2018, which designated the United States, which PCT application claimed the benefit of Japanese Patent Application No. 2017-071718 filed 31 Mar. 2017, the entire disclosures of each of which are incorporated herein by reference.

TECHNICAL FIELD

The present disclosure relates to a memory unit.

BACKGROUND ART

In recent years, a resistive random access memory (ReRAM) has received attention as a non-volatile memory device that allows for faster data access than a flash memory and the like. Examples of forms of ReRAMs include a structure called vertical 3D ReRAM; the vertical 3D ReRAM has a memory cell including a variable resistive element at each point of intersection of a word line (WL) horizontal to a board surface and a bit line (BL) vertical to the board surface.

CITATION LIST

Patent Literature

PTL 1: Japanese Unexamined Patent Application Publication No. 2015-170852
PTL 2: Japanese Unexamined Patent Application Publication No. 2016-167332

SUMMARY OF THE INVENTION

A significant development challenge for vertical 3D ReRAMs is to increase the number of stacks of word lines, which makes it possible to expand the capacity per unit area and to achieve a lower-cost memory unit. At this time, if the word lines are thick, this makes it difficult to produce bit lines. Thus, it is demanded that the word lines be made as thin as possible. On the other hand, if the word lines are made thin, this leads to an increase in sheet resistance value, and a decrease in voltage of the word lines during access to memory cells becomes a design constraint. Therefore, it is desirable to provide a memory unit that makes it possible to suppress the decrease in voltage of the word lines and achieve a fast access speed.

A first memory unit according to an embodiment of the present disclosure includes a memory cell array and a driving circuit that accesses the memory cell array. The memory cell array includes pluralities of first wiring lines, a plurality of second wiring lines, pluralities of third wiring lines, a plurality of resistance-varying memory cells, a plurality of transistors, and a plurality of fourth wiring lines. The pluralities of first wiring lines extend in a first direction. The pluralities of first wiring lines are disposed to be aligned in a second direction orthogonal to the first direction and in a third direction orthogonal to the first direction and the second direction. The plurality of second wiring lines extends in the first direction. The plurality of second wiring lines is disposed to be aligned in the second direction. The pluralities of third wiring lines extend in the third direction. The pluralities of third wiring lines are disposed to be aligned in the first direction and in the second direction, and are also disposed to go through a gap between two first wiring lines adjacent to each other in the second direction when viewed from the third direction. As for the plurality of resistance-varying memory cells, one memory cell is provided at each of respective points at which the third wiring lines and the first wiring lines are opposed to each other. As for the plurality of transistors, one transistor is provided for each of the third wiring lines. The gate of each of the plurality of transistors is coupled to the corresponding second wiring line. The plurality of fourth wiring lines extends in the second direction. The plurality of fourth wiring lines is disposed to be aligned in the first direction, and one fourth wiring line is provided for multiple third wiring lines disposed to be aligned in the second direction. Each of the fourth wiring lines is coupled to the corresponding multiple third wiring lines through the transistors. When, of the plurality of memory cells, multiple first memory cells whose corresponding fourth wiring line and first wiring line are different from one another are simultaneously accessed, the memory cell array allows for simultaneous access to the multiple first memory cells, without allowing for simultaneous access to memory cells corresponding to the fourth wiring lines shared by the first memory cells.

The first memory unit according to the embodiment of the present disclosure is configured, when, of the plurality of memory cells, multiple first memory cells whose corresponding fourth wiring line and first wiring line are different from one another are simultaneously accessed, to allow for simultaneous access to the multiple first memory cells, without allowing for simultaneous access to memory cells corresponding to the fourth wiring line shared by the first memory cells. Thus, it is possible to access multiple memory cells without concentrating an access current in one first wiring line.

A second memory unit according to an embodiment of the present disclosure includes a memory cell array and a driving circuit that accesses the memory cell array. The memory cell array includes pluralities of first wiring lines, a plurality of second wiring lines, pluralities of third wiring lines, a plurality of resistance-varying memory cells, a plurality of transistors, and a plurality of fourth wiring lines. The pluralities of first wiring lines extend in a first direction. The pluralities of first wiring lines are disposed to be aligned in a second direction orthogonal to the first direction and in a third direction orthogonal to the first direction and the second direction. The plurality of second wiring lines extends in the first direction. The plurality of second wiring lines is disposed to be aligned in the second direction. The pluralities of third wiring lines extend in the third direction. The pluralities of third wiring lines are disposed to be aligned in the first direction and in the second direction, and are also disposed to go through a gap between two first wiring lines adjacent to each other in the second direction when viewed from the third direction. As for the plurality of resistance-varying memory cells, one memory cell is provided at each of respective points at which the third wiring lines and the first wiring lines are opposed to each other. As for the plurality of transistors, one transistor is provided for each of the third wiring lines. The gate of each of the plurality of transistors is coupled to the corresponding second wiring line. The plurality of fourth wiring lines extends in the second direction. The plurality of fourth wiring lines is disposed to be aligned in the first direction, and one fourth wiring line is provided for multiple third wiring lines disposed to be aligned in the second direction. Each of the fourth wiring lines is coupled to the corresponding multiple third wiring lines through the transistors. In the second memory unit, the driving circuit simultaneously accesses, of the plurality of memory cells, multiple first memory cells whose corresponding fourth wiring line is shared by one another and corresponding first wiring line is different from one another.

In the second memory unit according to the embodiment of the present disclosure, of the plurality of memory cells, multiple first memory cells whose corresponding fourth wiring line is shared by one another and corresponding first wiring line is different from one another are simultaneously accessed. Thus, it is possible to write the same value in multiple memory cells without concentrating an access current in one first wiring line.

According to the first memory unit of the embodiment of the present disclosure, it is possible to access multiple memory cells without concentrating the access current in one first wiring line; therefore, it is possible to suppress a decrease in voltage of the first wiring lines and achieve a fast access speed.

According to the second memory unit of the embodiment of the present disclosure, it is possible to write the same value in multiple memory cells without concentrating the access current in one first wiring line; therefore, it is possible to suppress a decrease in voltage of the first wiring lines and achieve a fast access speed.

It is to be noted that effects of the present disclosure are not necessarily limited to those described here, and may be any of effects described in the present specification.

MODES FOR CARRYING OUT THE INVENTION

Figure 1:
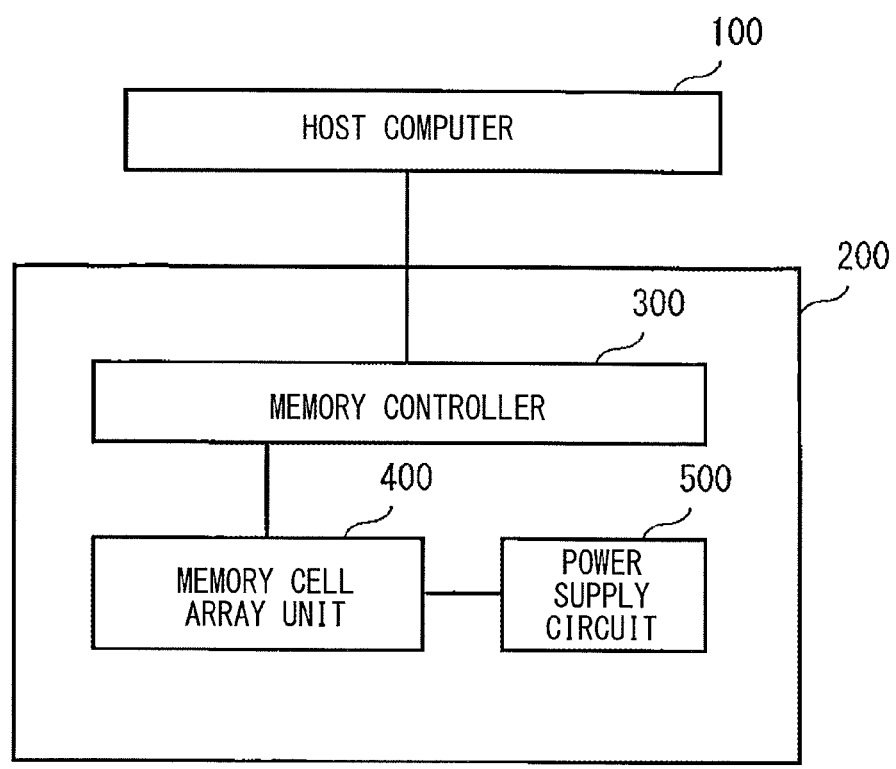
FIG. 1 illustrates a schematic configuration example of a memory unit according a first embodiment of the present disclosure.

In the following, some embodiments of the present disclosure are described in detail with reference to the drawings. The following description is a specific example of the present disclosure, and the present disclosure is not limited to the following embodiments. Furthermore, as for the dispositions, dimensions, dimension ratios, etc. of components, the present disclosure is not limited to those illustrated in the drawings.

1. First Embodiment
An example where a plurality of bit lines is disposed to be staggered (FIGS. 1 to 8)
Comparative Example: An example where a plurality of bit lines is disposed in a grid (FIG. 9)
2. Modification Examples of First Embodiment
Modification Example A: An example where short circuits of selection gate lines are omitted (FIG. 10)
Modification Example B: An example where the number of global bit lines is increased (FIG. 11)
Modification Example C: An example of 4-bit simultaneous access (FIG. 12)
3. Second Embodiment
An example where right and left comb-like word lines are each divided into two (FIGS. 13 to 19)
4. Modification Example of Second Embodiment
An example of 4-bit simultaneous access
5. Third Embodiment
An example where concentration of an access current is avoided by control of selection gate lines (FIGS. 20 to 22)
6. Fourth Embodiment
An example where a plurality of memory cell arrays is provided (FIGS. 23 to 26)

1. First Embodiment

[Configuration]
FIG. 1 illustrates an example of a functional block of an information processing system according to a first embodiment. This information processing system includes a host computer 100 and a memory unit 200. The memory unit 200 includes a memory controller 300), a memory cell array unit 400, and a power supply circuit 500.

(Host Computer 100)

The host computer 100 controls the memory unit 200. Specifically, the host computer 100 issues a command including a specified logical address of an access destination, and supplies the command and data to the memory unit 200. Furthermore, the host computer 100 receives data outputted from the memory unit 200. The command here is for controlling the memory unit 200, and includes, for example, a write command to perform a data writing process or a read command to perform a data readout process. Furthermore, the logical address is an address assigned to each region per unit of access when the host computer 100 accesses the memory unit 200 in an address space defined by the host computer 100. Hereinafter, this region per unit of access is referred to as a "sector".

(Memory Controller 300)

The memory controller 300 controls the memory cell army unit 400. The memory controller 300 receives a write command including a specified logical address from the host computer 100. Furthermore, the memory controller 300 performs a process of writing data in accordance with the write command. In this writing process, the logical address is converted into a physical address, and the data is written in the physical address. The physical address here is an address assigned to the memory cell array unit 400 in each unit of access when the memory controller 300 accesses the memory cell array unit 400. The unit of access by the memory controller 300 to the memory cell array unit 400 is, for example, equal to a sector. In this case, each sector of the memory cell array unit 400 is assigned a physical address. Meanwhile, if the memory controller 300 has received a read command including a specified logical address, the memory controller 300 converts the logical address into a physical address and reads out data from the physical address. Then, the memory controller 300 outputs, as read data, the read data to the host computer 100. The unit of access by the memory controller 300 may be the same as the unit of access by the host computer 100, or may be different from the unit of access by the host computer 100.

(Power Supply Circuit 500)

The power supply circuit 500 supplies a desired voltage to the memory cell array unit 400. Specifically, the power supply circuit 500 supplies various voltages desired depending on the operation mode (writing, readout, etc.) to a GBL driver 21, a WL driver 22, and an SG driver 23 that are described later.

(Memory Cell Array Unit 400)

Figure 2:
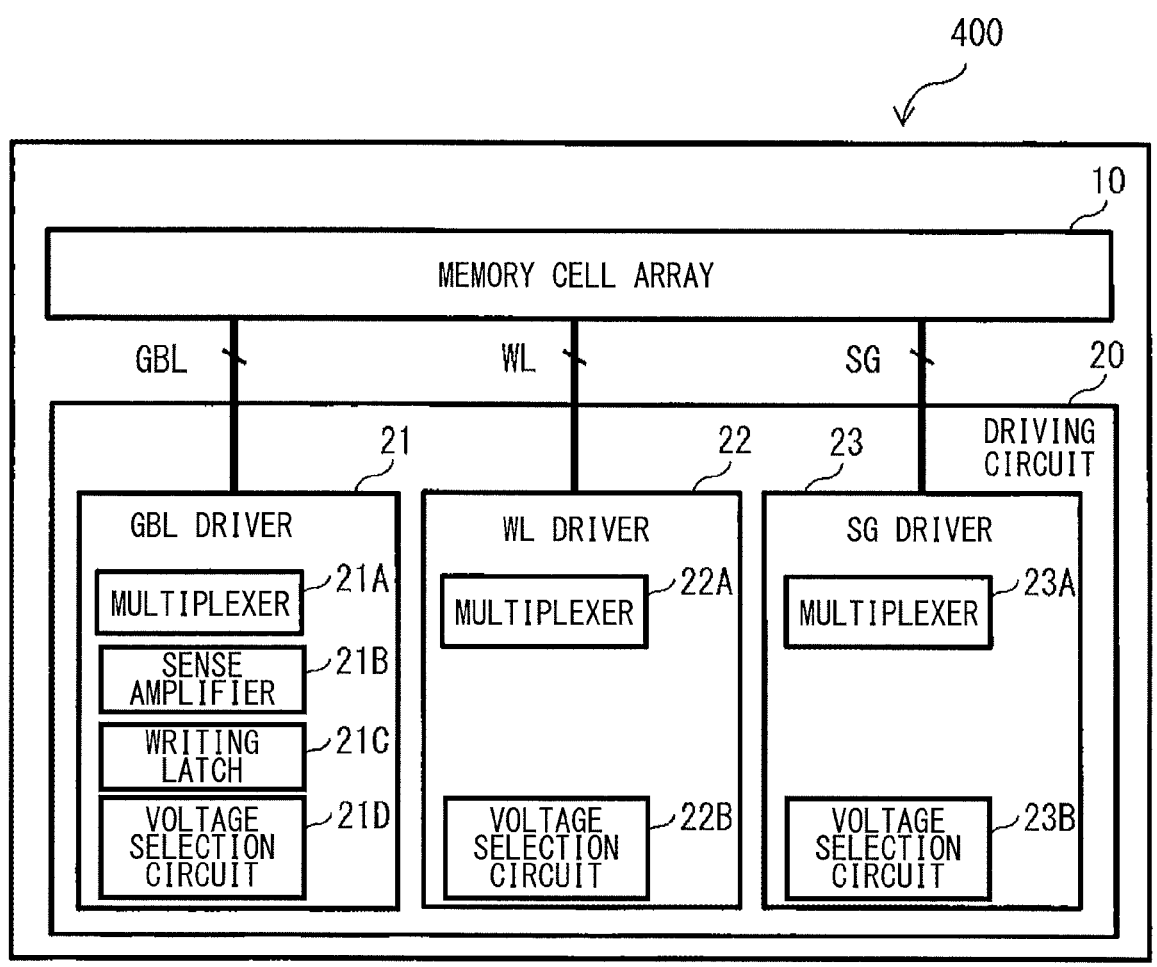
FIG. 2 illustrates a schematic configuration example of a memory cell array unit illustrated in FIG. 1.

Subsequently, the memory cell array unit 400 is described. FIG. 2 illustrates an example of a functional block of the memory cell array unit 400. The memory cell array unit 400 includes, for example, a semiconductor chip. The memory cell array unit 400 includes a memory cell array 10 and a driving circuit 20. The driving circuit 20 exchanges a command, write data, read data, etc. with the memory controller 300. The driving circuit 20 writes data in the memory cell array 10 in accordance with a write command, and reads out data from the memory cell array 10 in accordance with a read command. The driving circuit 20 is described in detail later.

Figure 3:
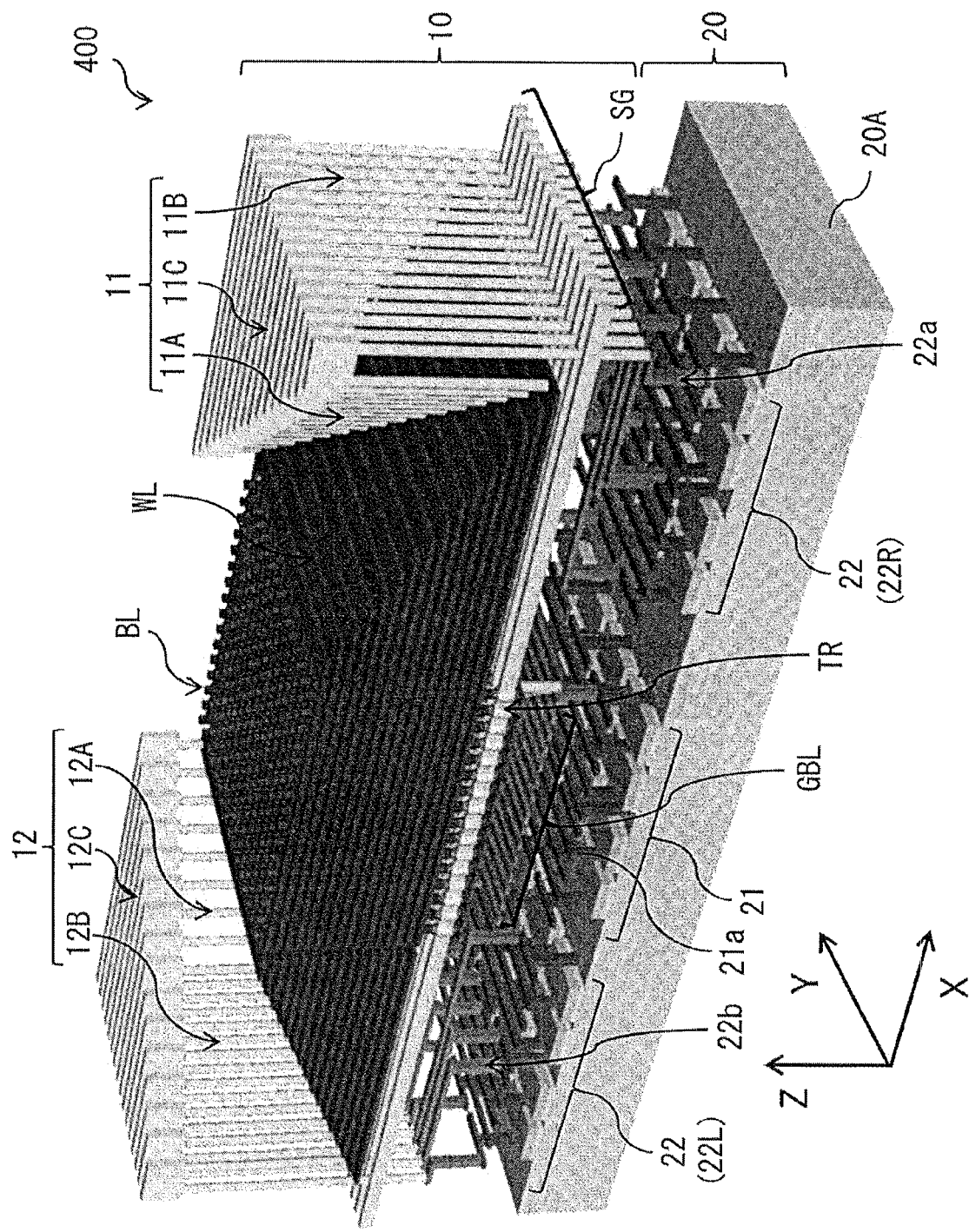
FIG. 3 is a perspective view illustrating a configuration example of a memory cell array illustrated in FIG. 1.
Figure 4:
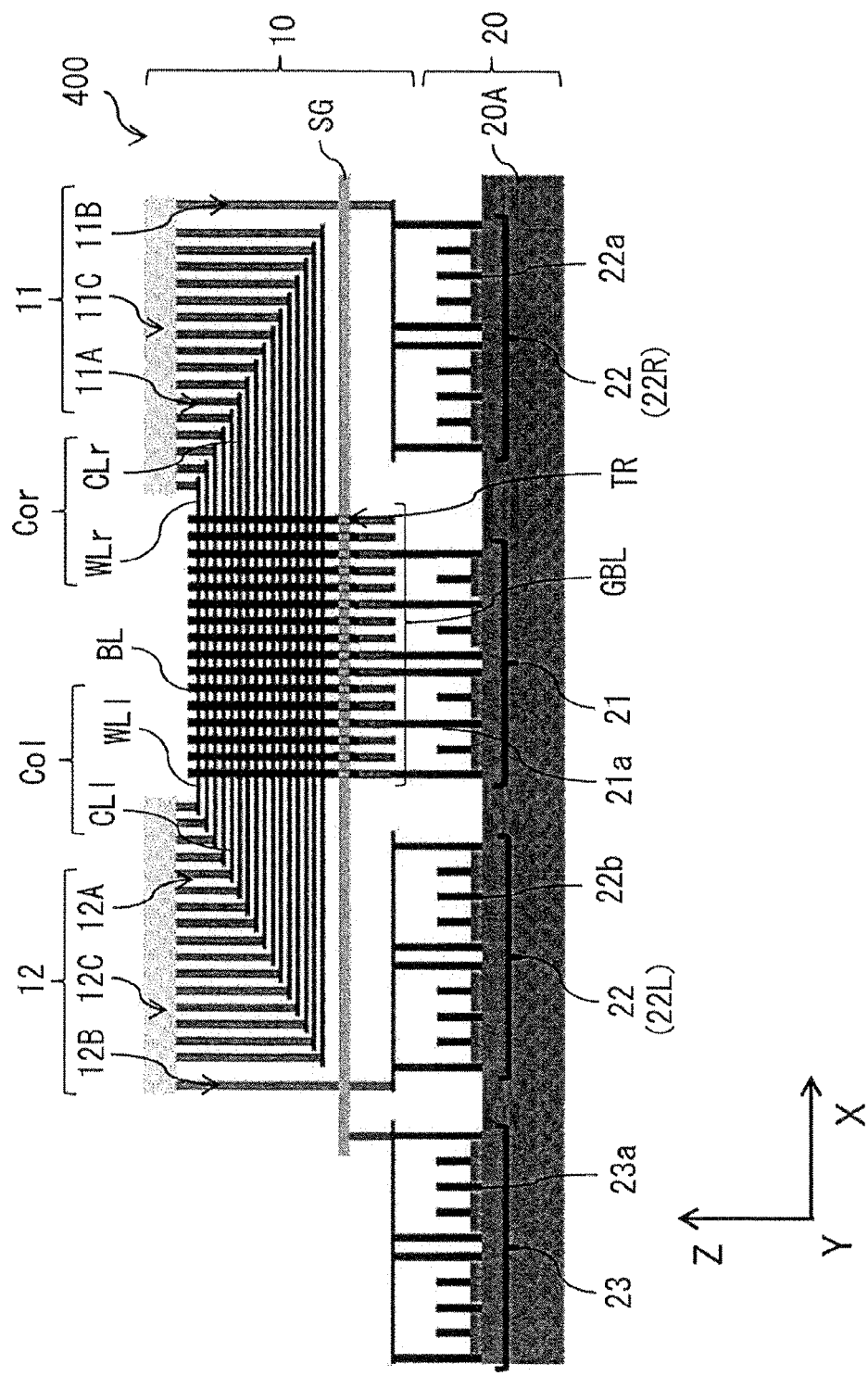
FIG. 4 is a side view illustrating a configuration example of the memory unit illustrated in FIG. 3.
Figure 5:
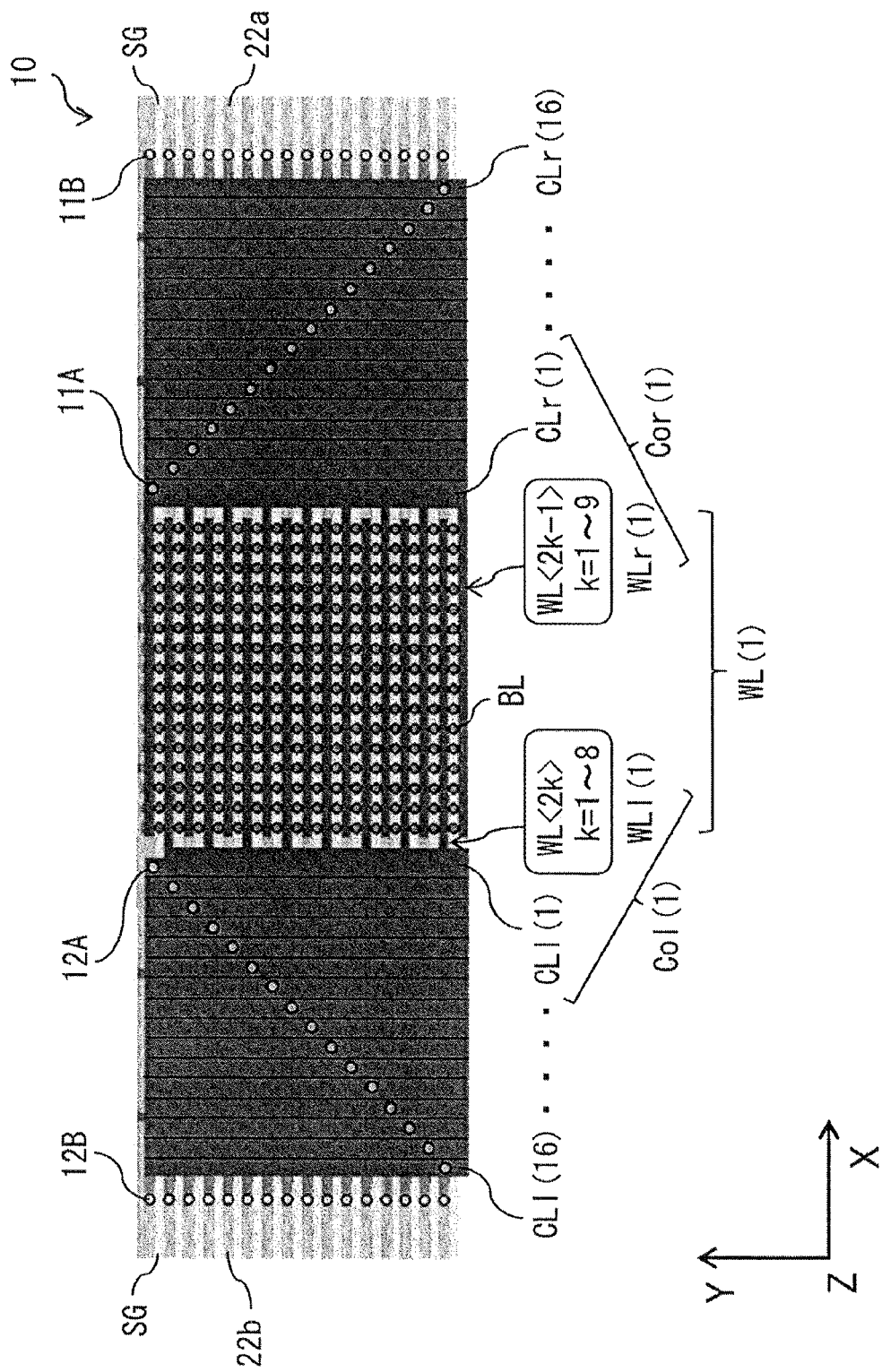
FIG. 5 is a top view illustrating the configuration example of the memory cell array illustrated in FIG. 3.
Figure 6:
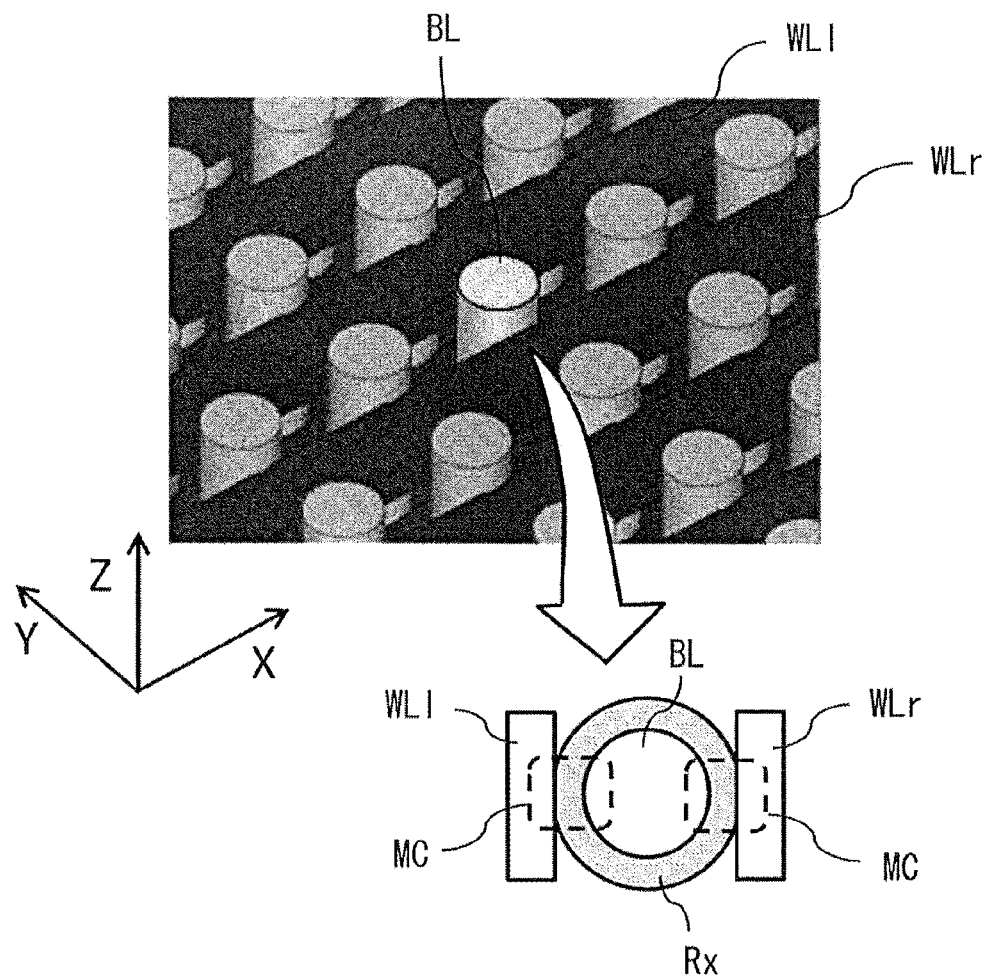
FIG. 6 is an enlarged view of a portion of the memory cell array illustrated in FIG. 3.
Figure 7:
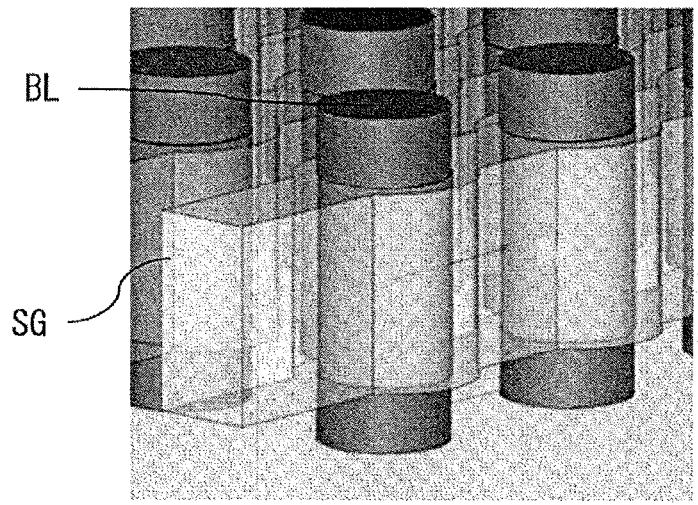
FIG. 7 is an enlarged view of a portion of the memory cell array illustrated in FIG. 3.

FIG. 3 is a perspective view illustrating a configuration example of the memory cell array unit 400. FIG. 4 is a side view illustrating the configuration example of the memory cell array unit 400. FIG. 5 is a top view illustrating the configuration example of the memory cell array unit 400. FIGS. 6 and 7 are enlarged views of a portion of the memory cell array unit 400.

(Memory Cell Array 10)

The memory cell array 10 has a so-called cross-point array structure, and includes, for example, as illustrated in FIGS. 3 to 6, one resistance-varying memory cell MC at each position (cross-point) at which a word line WL and a bit line BL are opposed to each other. In other words, the memory cell array 10 includes a plurality of word lines WL, a plurality of bit lines BL, and a plurality of memory cells MC disposed at cross-points in a manner of one memory cell MC at each cross-point. At each cross-point, for example, as illustrated in a lower right part of FIG. 6, the periphery of the bit line BL is covered with a resistance-varying layer Rx, and the word lines WL and the bit line BL are disposed to sandwich this resistance-varying layer Rx between them. The resistance-varying layer Rx is put into a low-resistance state, for example, by increasing an applied voltage to a predetermined threshold voltage or higher, and is put into a high-resistance state by decreasing the applied voltage to a voltage lower than the threshold voltage. The word lines WL correspond to a specific example of "first wiring lines" of the present disclosure. The bit lines BL correspond to a specific example of "third wiring lines" of the present disclosure. It is to be noted that in the following, the word lines WL are described simply as "WL". Likewise, the bit lines BL are described simply as "BL".

The memory cell array 10 further includes a plurality of selection gate lines SG, a plurality of vertical type transistors TR each having a gate coupled to the selection gate line SG, and a plurality of global bit lines GBL each coupled to multiple corresponding BL through the transistors TR. The selection gate lines SG correspond to a specific example of "second wiring lines" of the present disclosure. The global bit lines GBL correspond to a specific example of "fourth wiring lines" of the present disclosure. It is to be noted that in the following, the selection gate lines SG are described simply as "SG". Likewise, the global bit lines GBL are described simply as "GBL".

Each WL extends in an X-axis direction (a first direction). Pluralities of WL are disposed to be aligned in a Y-axis direction (a second direction) orthogonal to the X-axis direction and in a Z-axis direction (a third direction) orthogonal to both the X-axis direction and the Y-axis direction. The pluralities of WL have a hierarchical structure; in each hierarchy level, the plurality of WL is disposed to be aligned in the Y-axis direction. In the following, when a hierarchy level of WL or the like is explicitly stated, numbers (1), (2), (3), . . . are used as a hierarchy level, and a hierarchy level of the topmost surface is expressed by (1).

Each SG extends in the X-axis direction. A plurality of SG is disposed to be aligned in the Y-axis direction. Each BL extends in the Z-axis direction. Pluralities of BL are disposed to be aligned in the X-axis direction and in the Y-axis direction, and are also disposed to go through a gap between two WL adjacent to each other in the Y-axis direction when viewed from the Z-axis direction. Characteristics of an array of BL are described in detail later.

Each GBL extends in the Y-axis direction. A plurality of GBL is disposed to be aligned in the X-axis direction, and one GBL is provided for each set of multiple BL disposed to be aligned in the Y-axis direction. Each of the plurality of GBL is coupled to corresponding multiple BL through sources and drains of the transistors TR.

Here, in each hierarchy level, of the plurality of WL disposed to be aligned in the Y-axis direction, even-numbered multiple WL are electrically coupled to one another by left couplers CLl, and constitute comb teeth of left comb-tooth wiring lines Col. In each hierarchy level, the comb-tooth wiring lines Col include left multiple WL (WLl) and the left couplers CLl. For example, in the first hierarchy level, comb-tooth wiring lines Col(1) include multiple WLl (1) (for example, eight WL<2k> (k=1 to 8) corresponding to even-numbered WL) and couplers CLl(1). The couplers CLl correspond to a specific example of "second couplers" of the present disclosure. The comb-tooth wiring lines Col correspond to a specific example of "second comb-tooth wiring lines" of the present disclosure.

In each hierarchy level, of the plurality of WL disposed to be aligned in the Y-axis direction, odd-numbered multiple WL are electrically coupled to one another by right couplers CLr, and constitute comb teeth of right comb-tooth wiring lines Cor. In each hierarchy level, the comb-tooth wiring lines Cor include right multiple WL (WLr) and the right couplers CLr. For example, in the first hierarchy level, comb-tooth wiring lines Cor(1) include multiple WLr(1) (for example, nine WL<2k-1> (k=1 to 9) corresponding to odd-numbered WL) and couplers CLr(1). The couplers CLr correspond to a specific example of "first couplers" of the present disclosure. The comb-tooth wiring lines Cor correspond to a specific example of "first comb-tooth wiring lines" of the present disclosure.

In the plurality of comb-tooth wiring lines Cor, respective couplers CLr, which couple the multiple WLr to one another, decrease in their length in the X-axis direction with increasing distance from a circuit board 20A; thus, the plurality of couplers CLr is disposed in tiers. In the plurality of comb-tooth wiring lines Col, respective couplers CLl, which couple the multiple WLl to one another, decrease in their length in the X-axis direction with increasing distance from the circuit board 20A; thus, the plurality of couplers CLl is disposed in tiers.

The driving circuit 20 is configured to simultaneously select, of the plurality of SG, multiple SG not adjacent to one another, thereby being able to access multiple memory cells MC. Specifically, the driving circuit 20 includes the GBL driver 21 (a first driving circuit) that drives the plurality of GBL, the WL driver 22 (a second driving circuit) that drives the plurality of WL, and the SG driver 23 (a third driving circuit) that drives the plurality of SG.

The GBL driver 21 selects multiple GBL from the plurality of GBL on the basis of control by the memory controller 300. The GBL driver 21 includes, for example, a writing latch 21C that temporarily stores therein a value to be written in a memory cell MC and a sense amplifier 21B that determines and outputs the value recorded in the memory cell MC. The GBL driver 21 further includes, for example, a voltage selection circuit 21D that switches and supplies a voltage applied to selected/non-selected GBL depending on the operation mode (readout, writing, etc.) and the value to be written. The voltage selection circuit 21D determines a voltage to be applied to GBL on the basis of, for example, writing data Wdata inputted from the writing latch 21C. The GBL driver 21 further includes, for example, a multiplexer 21A that selects certain GBL from the plurality of GBL, and applies the voltage supplied from the voltage selection circuit 21D to the selected GBL and applies a predetermined fixed voltage to non-selected GBL.

The WL driver 22 applies a predetermined voltage to WL on the basis of control by the memory controller 300. The WL driver 22 includes, for example, a voltage selection circuit 22B that switches and supplies a voltage applied to selected/non-selected WL depending on the operation mode (readout, writing, etc.) and the value to be written. The WL driver 22 further includes, for example, a multiplexer 22A that selects certain WL from the plurality of WL, and applies the voltage supplied from the voltage selection circuit 22B to the selected WL and applies a predetermined fixed voltage to non-selected WL.

The SG driver 23 selects multiple SG from the plurality of SG on the basis of control by the memory controller 300. The SG driver 23 includes, for example, a voltage selection circuit 23B that switches and supplies a voltage applied to selected/non-selected SG depending on the operation mode (readout, writing, etc.) and the value to be written. The SG driver 23 further includes, for example, a multiplexer 23A that selects certain SG from the plurality of SG, and applies the voltage supplied from the voltage selection circuit 23B to the selected SG and applies a predetermined fixed voltage to non-selected SG.

The driving circuit 20 includes the circuit board 20A electrically coupled to the memory cell array 10. The circuit board 20A is provided with, for example, the GBL driver 21, the two WL drivers 22, and the SG driver 23. The GBL driver 21 is electrically coupled to BGL through a coupler 21a. The GBL driver 21 is disposed, for example, in a position opposed to GBL. One of the WL drivers 22 (the WL driver 22R) is electrically coupled to the couplers CLr of the comb-tooth wiring lines Cor through a coupler 22a and a coupler 11, and is provided, for example, in a position adjacent to the GBL driver 21 in the X-axis direction. The other WL driver 22 (22L) is electrically coupled to the couplers CLl of the comb-tooth wiring lines Col through a coupler 22b and a coupler 12, and is provided, for example, in a position adjacent to the GBL driver 21 on the side opposite to the WL driver 22 (22R) in the X-axis direction. The SG driver 23 is electrically coupled to SG through a coupler 23a. The SG driver 23 is provided, for example, in a position adjacent to the WL driver 22 (22R) on the side opposite to the GBL driver 21 in the X-axis direction.

The coupler 11 is a wiring line provided in the memory cell array 10, and is coupled to the couplers CLr of the comb-tooth wiring lines Car. The coupler 12 is a wiring line provided in the memory cell array 10, and is coupled to the couplers CU of the comb-tooth wiring lines Col.

The coupler 11 includes a plurality of coupling wiring lines 11A (first coupling wiring lines), a plurality of coupling wiring lines 11B (some of third coupling wiring lines), and a plurality of coupling wiring lines 11C (fourth coupling wiring lines). The plurality of coupling wiring lines 11A is electrically coupled to the end edges of the plurality of CLr in the X-axis direction, extends in the Z-axis direction, and is disposed to be aligned in a direction intersecting with both the X-axis direction and the Y-axis direction. The plurality of coupling wiring lines 11B is electrically coupled to the WL driver 22 (22R), extends in the Z-axis direction, and is disposed to be aligned in the Y-axis direction. The plurality of coupling wiring lines 11C extends in the X-axis direction, is disposed to be aligned in the Y-axis direction, and electrically couples the plurality of coupling wiring lines 11A and the plurality of coupling wiring lines 11B to each other. In other words, the coupler 11 is formed so that respective wiring lines coupling the plurality of CLr to the WL driver 22 (22R) are roughly uniform in length.

The coupler 12 includes a plurality of coupling wiring lines 12A (second coupling wiring lines), a plurality of coupling wiring lines 12B (some of the third coupling wiring lines), and a plurality of coupling wiring lines 12C (fifth coupling wiring lines). The plurality of coupling wiring lines 12A is electrically coupled to the end edges of the plurality of CL1 in the X-axis direction, extends in the Z-axis direction, and is disposed to be aligned in a direction intersecting with both the X-axis direction and the Y-axis direction. The plurality of coupling wiring lines 12B is electrically coupled to the WL driver 22 (22L), extends in the Z-axis direction, and is disposed to be aligned in the Y-axis direction. The plurality of coupling wiring lines 12C extends in the X-axis direction, is disposed to be aligned in the Y-axis direction, and electrically couples the plurality of coupling wiring lines 12A and the plurality of coupling wiring lines 12B to each other. In other words, the coupler 12 is formed so that respective wiring lines coupling the plurality of CL1 to the WL driver 22 (22L) are roughly uniform in length.

Figure 8:
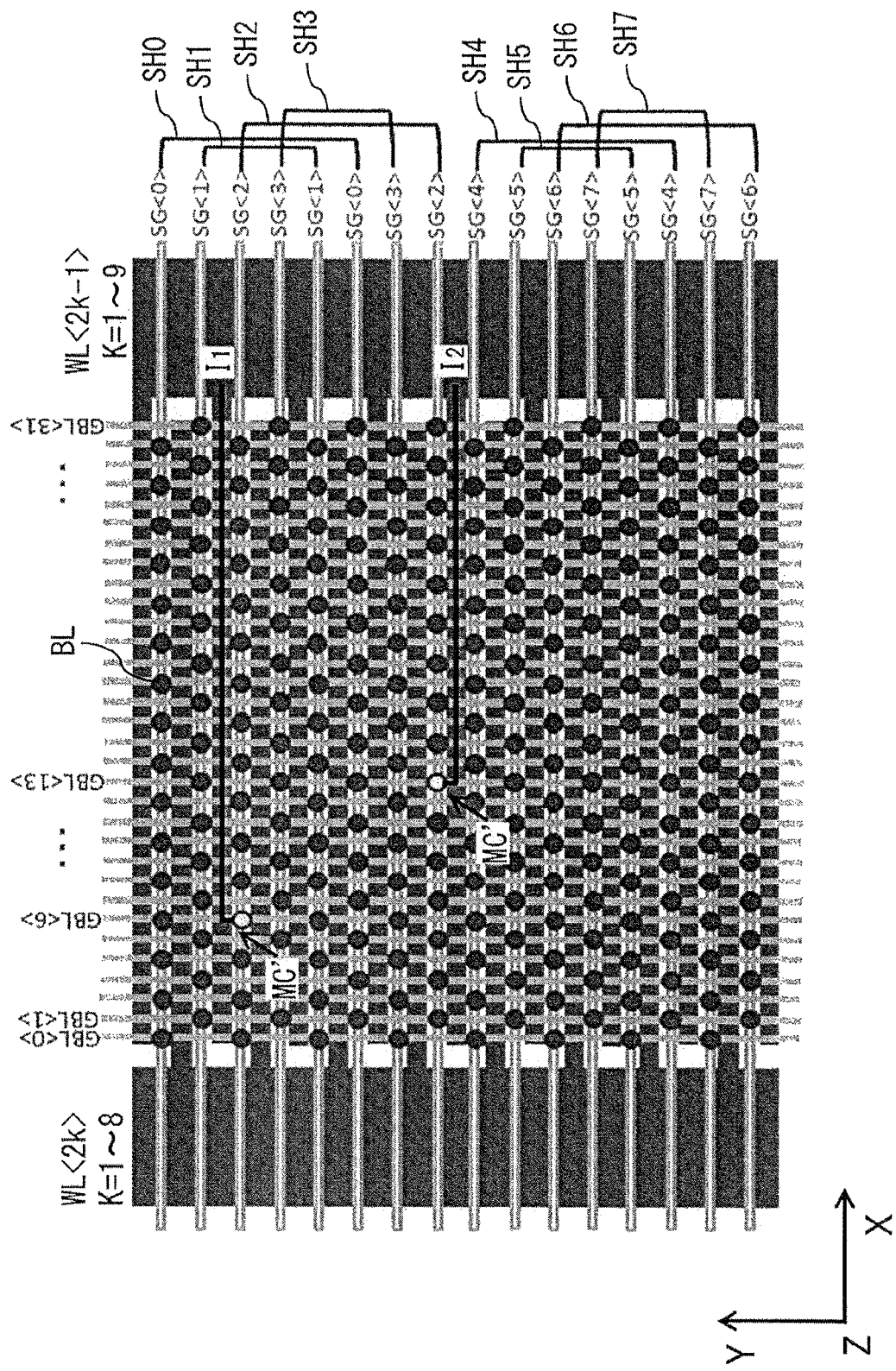
FIG. 8 schematically illustrates an example of a layout of wiring lines of the memory cell array illustrated in FIG. 3.
Figure 9:
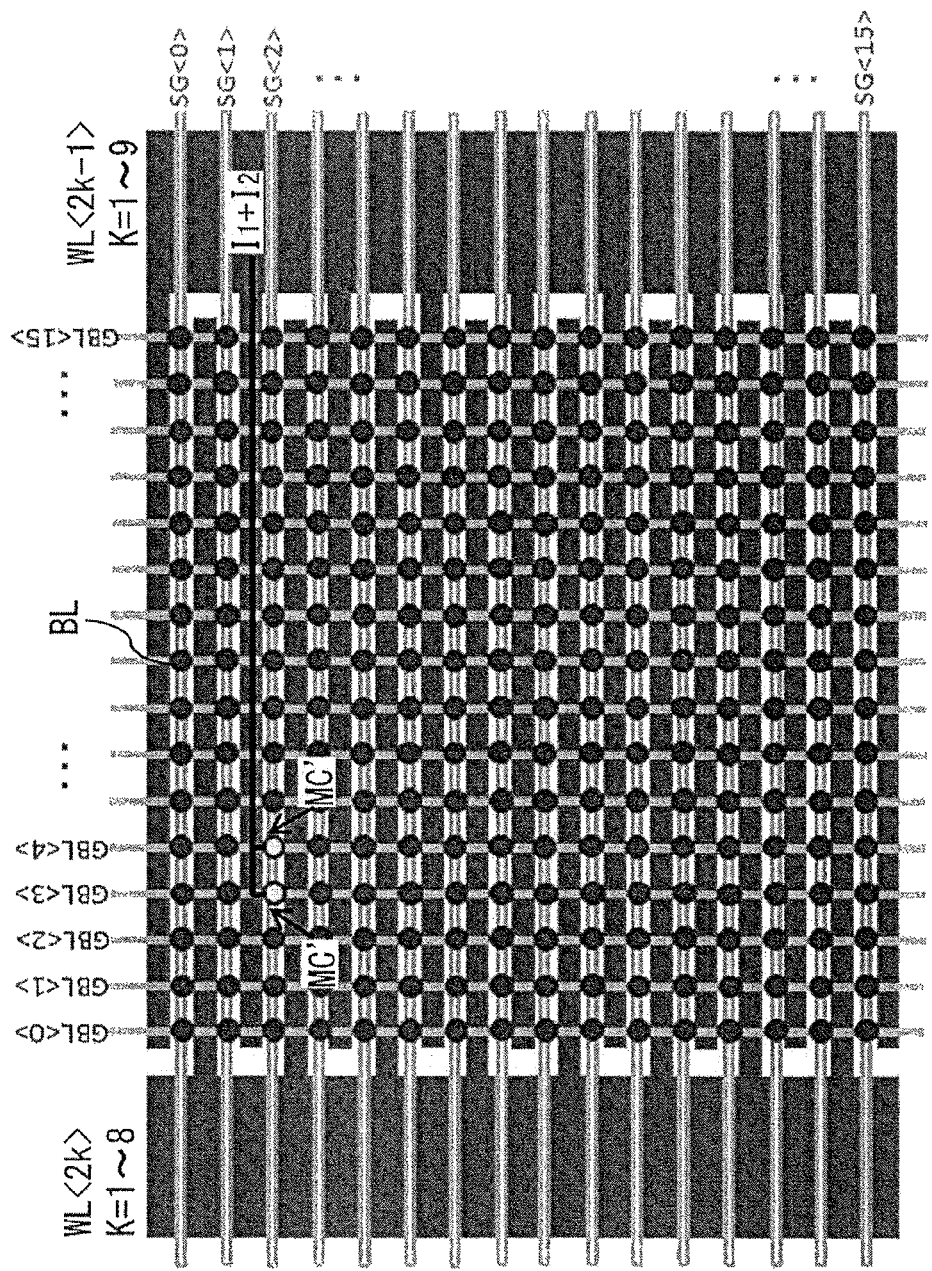
FIG. 9 schematically illustrates a layout of wiring lines of a memory cell array according to a comparative example.

FIG. 8 schematically illustrates an example of a layout of the wiring lines of the memory cell array 10. FIG. 9 schematically illustrates a layout of wiring lines of a memory cell array according to a comparative example. It is to be noted that in FIGS. 8 and 9, for ease of explanation, SG and GBL are disposed on top of WL as a matter of convenience.

The memory cell array 10 is configured, when, of the plurality of memory cells MC, multiple memory cells MC' whose corresponding GBL and WL are different from one another are simultaneously accessed, to allow for simultaneous access to the multiple memory cells MC', without allowing for simultaneous access to memory cells MC corresponding to GBL shared by the memory cells MC'. The memory cells MC' correspond to a specific example of "first memory cells" of the present disclosure.

Specifically, the pluralities of BL are disposed to be aligned in the X-axis direction at an equal interval of twice the size of an array pitch of the plurality of GBL and in the Y-axis direction at an equal interval of twice the size of an array pitch of the plurality of WL Furthermore, multiple BL corresponding to two GBL adjacent to each other are disposed to be staggered (i.e., in zigzags) in an XY plane. In addition, the memory cell array 10 further includes a plurality of couplers SH (for example, SH0 to SH7) that electrically couples, of the plurality of SG, two SG not adjacent to each other. Thus, by the driving circuit 20 simultaneously selecting two GBL and simultaneously selecting, of the plurality of SG, two SG not adjacent to each other, it becomes possible to simultaneously access, of the plurality of memory cells MC, two memory cells MC' whose corresponding GBL and WL are different from each other, and it does not happen that memory cells MC corresponding to GBL shared by the memory cells MC' are simultaneously accessed. For example, when GBL<6> and GBL<13> are selected, and two SG<2> are selected through the coupler SH2, it is possible to access only a memory cell MC' corresponding to a point at which GBL<6> and one of SG<2> intersect with each other and a memory cell MC' corresponding to a point at which GBL<13> and the other SG<2> intersect with each other. Therefore, it is possible to access the two memory cells MC' without concentrating an access current in one WL.

Meanwhile, in the memory cell array according to the comparative example, pluralities of BL are disposed to be aligned in the X-axis direction at an equal interval of the same size as an array pitch of a plurality of GBL and in the Y-axis direction at an equal interval of the same size as an array pitch of a plurality of WL. Accordingly, for example, as illustrated in FIG. 9, an access current flowing into memory cells MC' is concentrated in one WL. It is to be noted that in the memory cell array according to the comparative example, in a case where multiple memory cells MC' whose corresponding WL is different from one another are accessed, memory cells MC corresponding to GBL shared by the memory cells MC' are also accessed simultaneously. Thus, in the memory cell array according to the comparative example, it is not possible to access two memory cells MC' whose corresponding WL is different from each other.

[Effects]

Subsequently, effects of the memory unit 200 according to the present embodiment are described.

A challenge for a vertical 3D ReRAM that has received attention in recent years is to increase the number of stacks of word lines, thereby expanding the capacity per unit area and achieving a lower-cost memory unit. From a standpoint of ease of production of bit lines, the word lines are preferably made as thin as possible. However, if the word lines are made thin, this leads to an increase in sheet resistance value, and a decrease in voltage of the word lines during access to memory cells becomes a design constraint.

Meanwhile, in the memory unit 200 according to the present embodiment, the memory cell array 10 is configured, when, of the plurality of memory cells MC, multiple memory cells MC' whose corresponding GBL and WL are different from one another are simultaneously accessed, to allow for simultaneous access to the multiple memory cells MC', without allowing for simultaneous access to memory cells MC corresponding to GBL shared by the memory cells MC'. Specifically, the pluralities of BL are disposed to be aligned in the X-axis direction at an equal interval of twice the size of the array pitch of the plurality of GBL and in the Y-axis direction at an equal interval of twice the size of the array pitch of the plurality of WL. Furthermore, multiple BL corresponding to two GBL adjacent to each other are disposed to be staggered (i.e., in zigzags) in the XY plane. In addition, the memory cell array 10 further includes the plurality of couplers SH (for example, SH0 to SH7) that electrically couples, of the plurality of SG, two SG not adjacent to each other. Thus, it is possible to access multiple memory cells MC' without concentrating the access current in one WL. Consequently, it is possible to suppress a decrease in voltage of WL and achieve a fast access speed.

Furthermore, in the memory unit 200 according to the present embodiment, in each hierarchy level, even-numbered multiple WL (WLl) are electrically coupled to one another by the couplers CLl, and constitute the comb teeth of the comb-tooth wiring lines Col. Moreover, in each hierarchy level, odd-numbered multiple WL (WLr) are electrically coupled to one another by the couplers CLr, and constitute the comb teeth of the comb-tooth wiring lines Cor. Thus, it is possible to reduce the number of WL driven by the WL driver 22 in real terms, and therefore is possible to reduce the circuit scale of the WL driver 22.

Furthermore, in the memory unit 200 according to the present embodiment, the plurality of couplers SH that electrically couples, of the plurality of SG, two SG not adjacent to each other is provided in the memory cell array 10. Thus, it is possible to reduce the number of SG driven by the SG driver 23 in real terms, and therefore is possible to reduce the circuit scale of the SG driver 23.

Moreover, in the memory unit 200 according to the present embodiment, the plurality of couplers CLr is disposed in tiers, and the plurality of couplers CLl is disposed in tiers. Furthermore, the coupler 11 is formed so that the respective wiring lines coupling the plurality of CLr to the WL driver 22 (22R) are roughly uniform in length, and the coupler 12 is formed so that the respective wiring lines coupling the plurality of CLl to the WL driver 22 (22L) are roughly uniform in length. Thus, it is possible to make respective voltage values supplied from the WL drivers 22 to WL uniform, and therefore is possible to suppress variations in the voltage value among WL depending on the distance from the end of WL.

2. Modification Examples of First Embodiment

Modification examples of the memory cell array 10 according to the foregoing embodiment are described below. It is to be noted that in the following, a common component with the foregoing embodiment is assigned the same reference numeral as the component in the foregoing embodiment. Furthermore, different components from the foregoing embodiment are mainly described, and description of common components with the foregoing embodiment is omitted as appropriate.

Modification Example A

Figure 10:
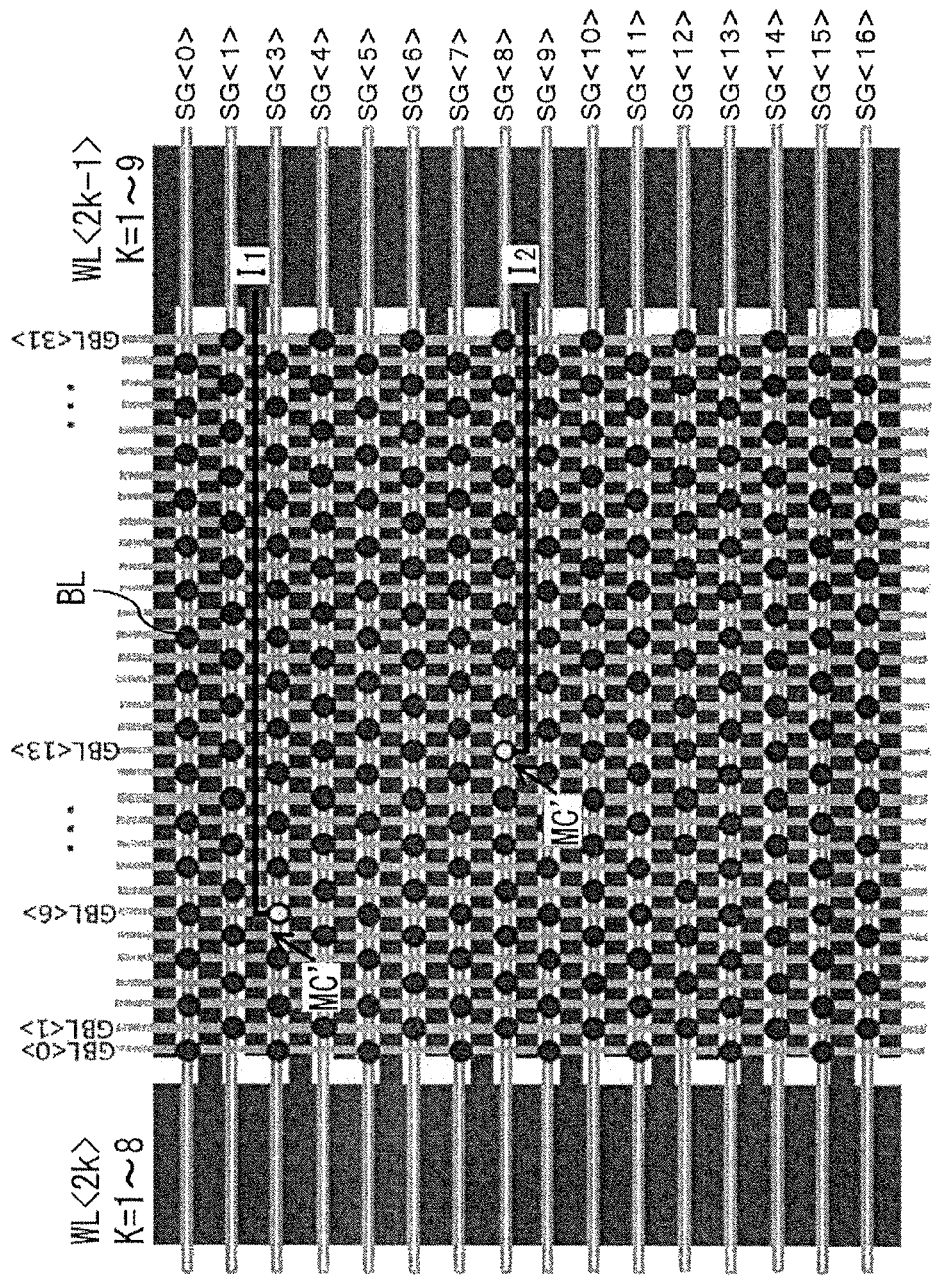
FIG. 10 schematically illustrates a modification example of the layout of the wiring lines of the memory cell array illustrated in FIG. 8.

FIG. 10 illustrates a modification example of the memory cell array 10 according to the foregoing embodiment. The memory cell array 10 according to the present modification example corresponds to a modification of the memory cell array 10 according to the foregoing embodiment, where the couplers SH are omitted. In this case, the driving circuit 20 simultaneously selects, of the plurality of SG, multiple (for example, two) SG not adjacent to one another. This allows for, when, of the plurality of memory cells MC, multiple memory cells MC' whose corresponding GBL and WL are different from one another are simultaneously accessed, simultaneous access to the multiple memory cells MC', without allowing for simultaneous access to memory cells MC corresponding to GBL shared by the memory cells MC'. For example, when GBL<6> and GBL<13> are selected, and SG<3> and SG<8> are selected, it is possible to access a memory cell MC' corresponding to a point at which GBL<6> and SG<6> intersect with each other and a memory cell MC' corresponding to a point at which GBL<13> and SG<8> intersect with each other. Therefore, as with the foregoing embodiment, it is possible to suppress a decrease in voltage of WL and achieve a fast access speed.

Modification Example B

Figure 11:
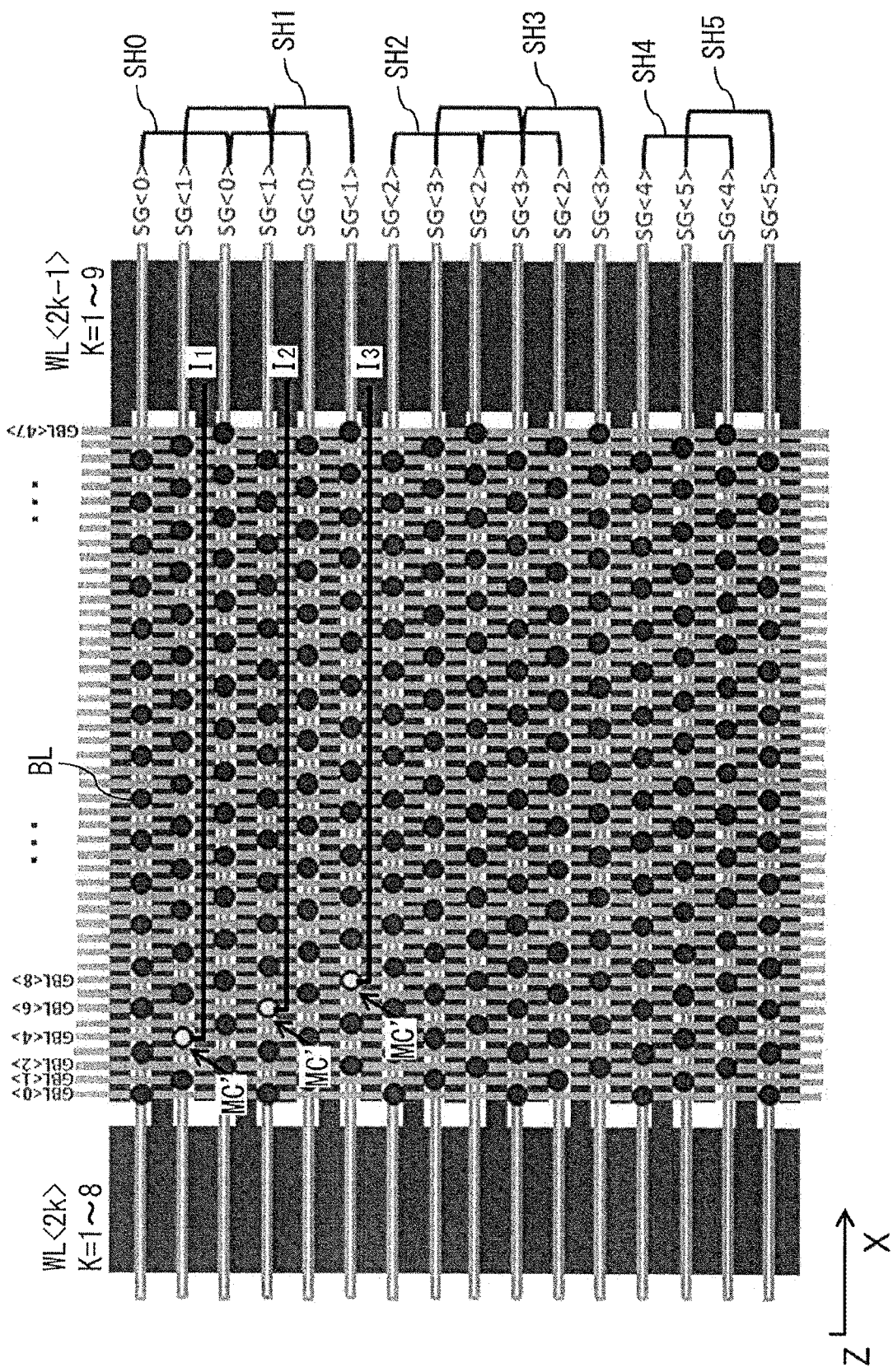
FIG. 11 schematically illustrates a modification example of the layout of the wiring lines of the memory cell array illustrated in FIG. 8.

FIG. 11 illustrates a modification example of the memory cell array 10 according to the foregoing embodiment. The memory cell array 10 according to the present modification example is configured, when, of the plurality of memory cells MC, three memory cells MC' whose corresponding GBL and WL are different from one another are simultaneously accessed, to allow for simultaneous access to the three memory cells MC', without allowing for simultaneous access to memory cells MC corresponding to GBL shared by the memory cells MC'.

Specifically, the pluralities of BL are disposed to be aligned in the X-axis direction at an equal interval of three times the size of the array pitch of the plurality of GBL and in the Y-axis direction at an equal interval of three times the size of the array pitch of the plurality of WL. Furthermore, multiple BL corresponding to three GBL adjacent to one another are disposed to be staggered in the XY plane. In addition, the memory cell array 10 further includes a plurality of couplers SH (for example, SH0 to SH5) that electrically couples, of the plurality of SG, three SG not adjacent to one another. Thus, for example, when GBL<4>, GBL<6>, and GBL<8> are selected, and three SG<1> are selected through the coupler SH1, it is possible to access a memory cell MC corresponding to a point at which GBL<4> and the first SG<1> intersect with each other, a memory cell MC' corresponding to a point at which GBL<6> and the second SG<1> intersect with each other, and a memory cell MC' corresponding to a point at which GBL<8> and the third SG<1> intersect with each other. Therefore, it is possible to access multiple memory cells MC' without concentrating the access current in one WL.

It is to be noted that in the present modification example, the memory cell array 10 may be configured, when, of the plurality of memory cells MC, four or more memory cells MC' whose corresponding GBL and WL are different from one another are simultaneously accessed, to allow for simultaneous access to the four or more memory cells MC', without allowing for simultaneous access to memory cells MC corresponding to GBL shared by the memory cells MC'. Even in this case, as with the present modification example, it is possible to access multiple memory cells MC' without concentrating the access current in one WL.

Modification Example C

Figure 12:
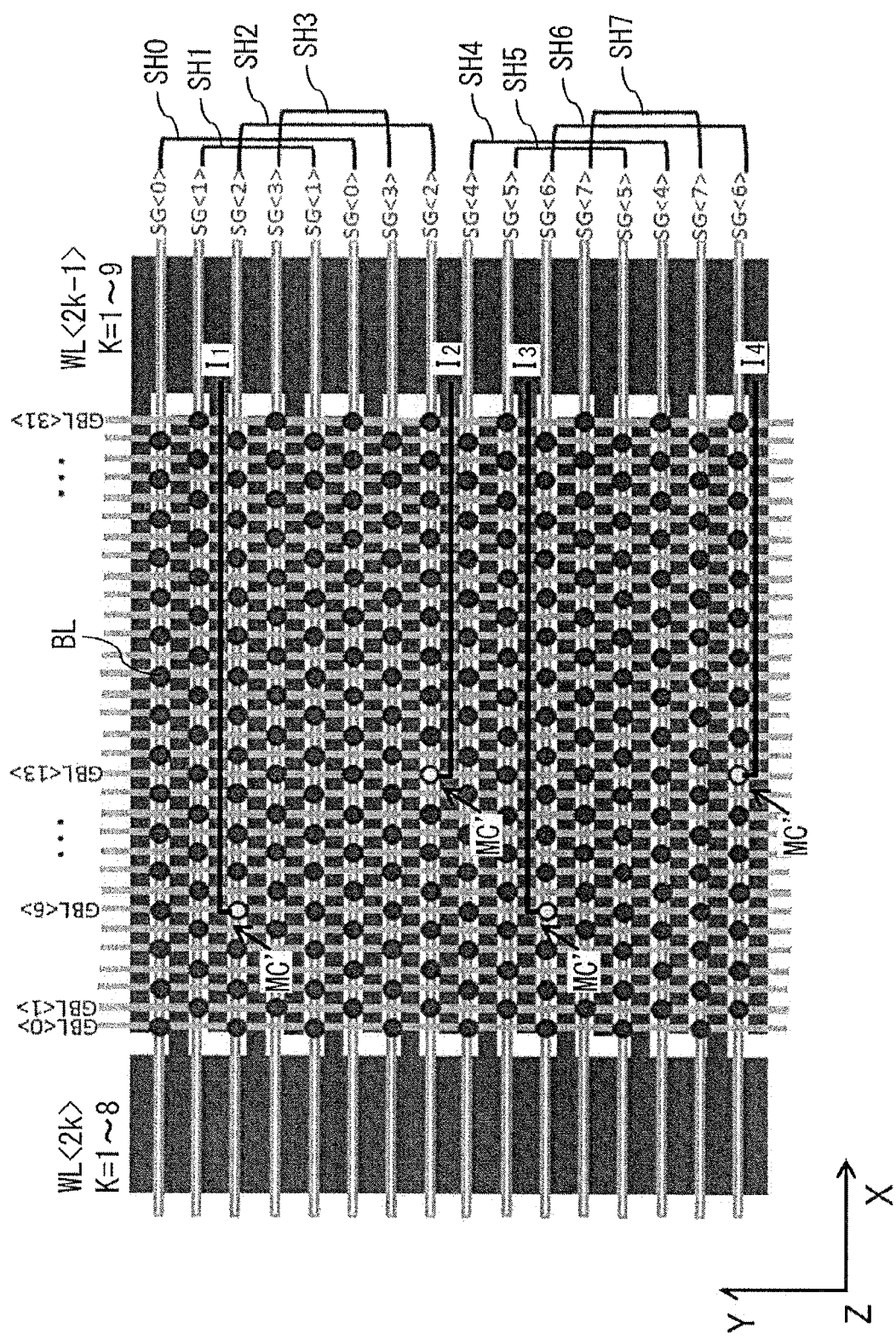
FIG. 12 schematically illustrates a modification example of the layout of the wiring lines of the memory cell array illustrated in FIG. 8.

FIG. 12 illustrates a modification example of the memory cell array 10 according to the foregoing embodiment. The memory cell array 10 according to the present modification example corresponds to a modification of the memory cell array 10 according to the foregoing embodiment, where the number of the couplers SH selected is 2. In the present modification example, for example, when GBL<6> and GBL<8> are selected, two SG<2> are selected through the coupler SH1, and two SG<6> are selected through the coupler SH6, it is possible to access a memory cell MC' corresponding to a point at which GBL<6> and the first SG<2> intersect with each other, a memory cell MC' corresponding to a point at which GBL<13> and the second SG<2> intersect with each other, a memory cell MC' corresponding to a point at which GBL<6> and the first SG<6> intersect with each other, and a memory cell MC' corresponding to a point at which GBL<13> and the second SG<6> intersect with each other. Therefore, also in the present modification example, it is possible to access multiple memory cells MC' without concentrating the access current in one WL.

3. Second Embodiment

Figure 13:
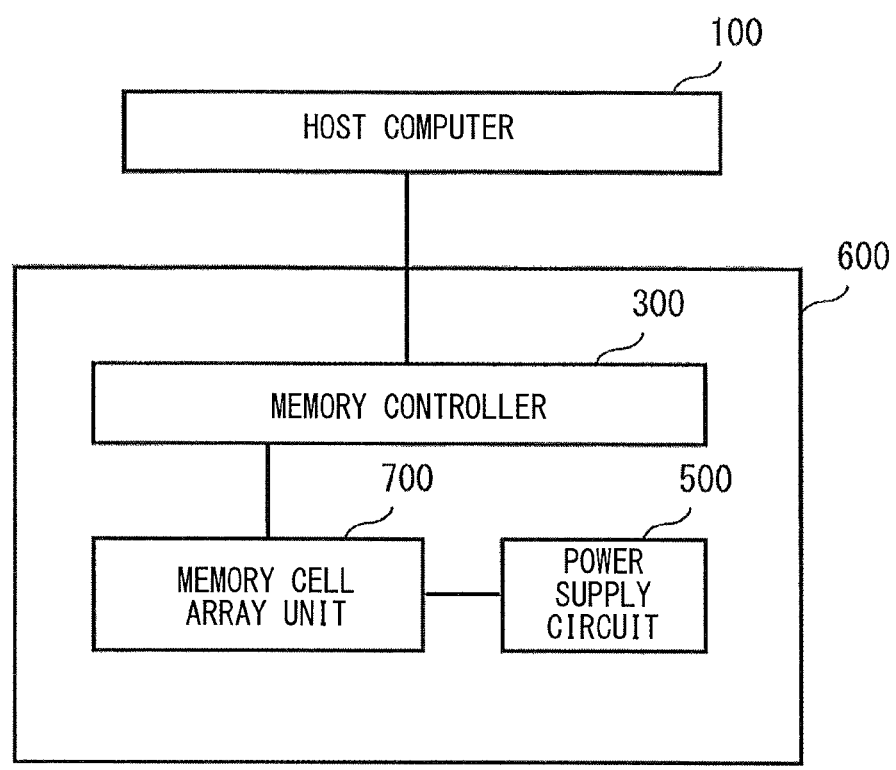
FIG. 13 illustrates a schematic configuration example of a memory unit according to a second embodiment of the present disclosure.

FIG. 13 illustrates an example of a functional block of an information processing system according to a second embodiment. This information processing system includes the host computer 100 and a memory unit 600. The memory unit 600 includes the memory controller 300, a memory cell array unit 700, and the power supply circuit 500.

The host computer 100 controls the memory unit 600. The memory controller 300 controls the memory cell array unit 700. The power supply circuit 500 supplies a desired voltage to the memory cell array unit 700.

Figure 14:
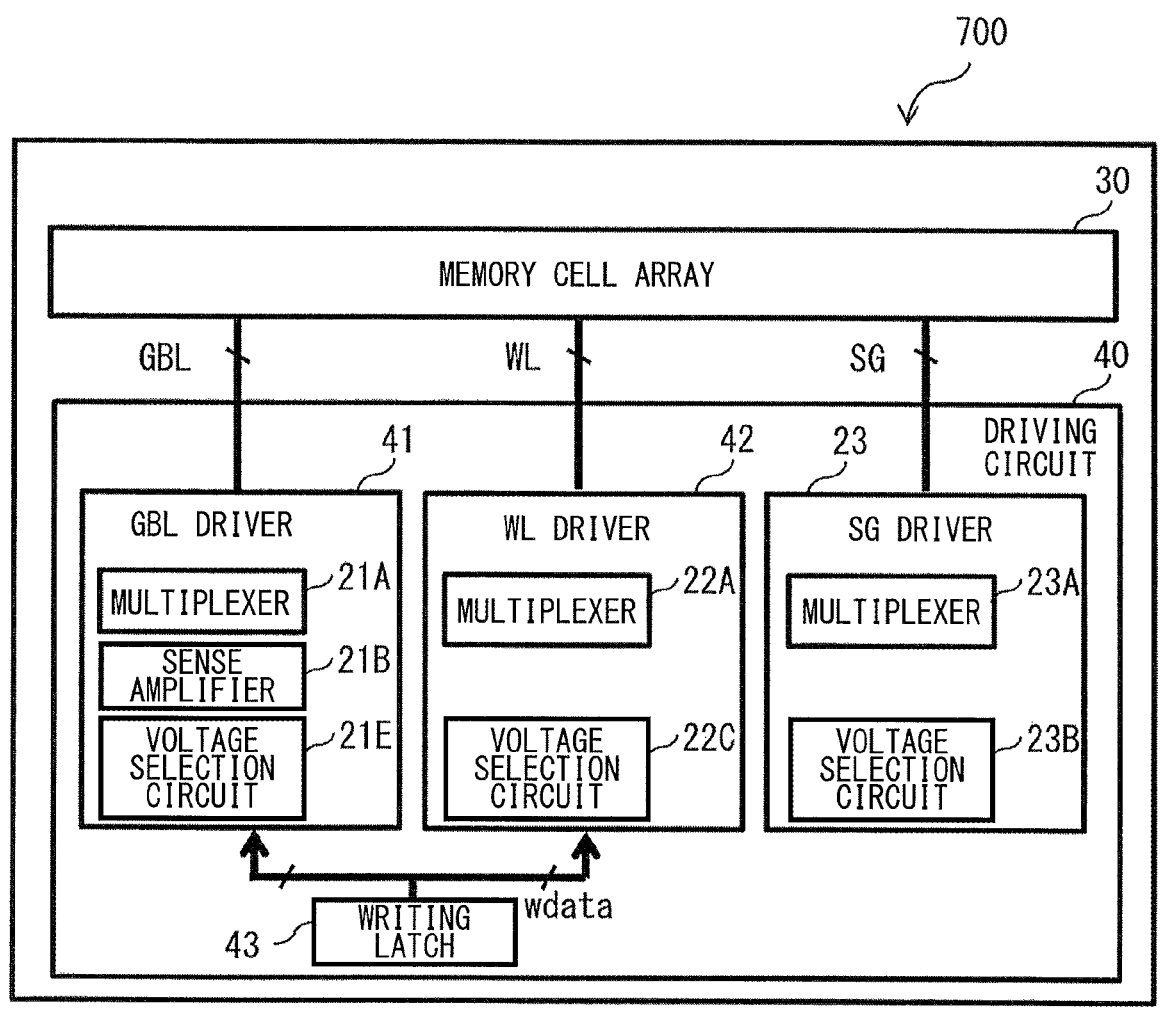
FIG. 14 illustrates a schematic configuration example of a memory cell array unit illustrated in FIG. 13.
Figure 15:
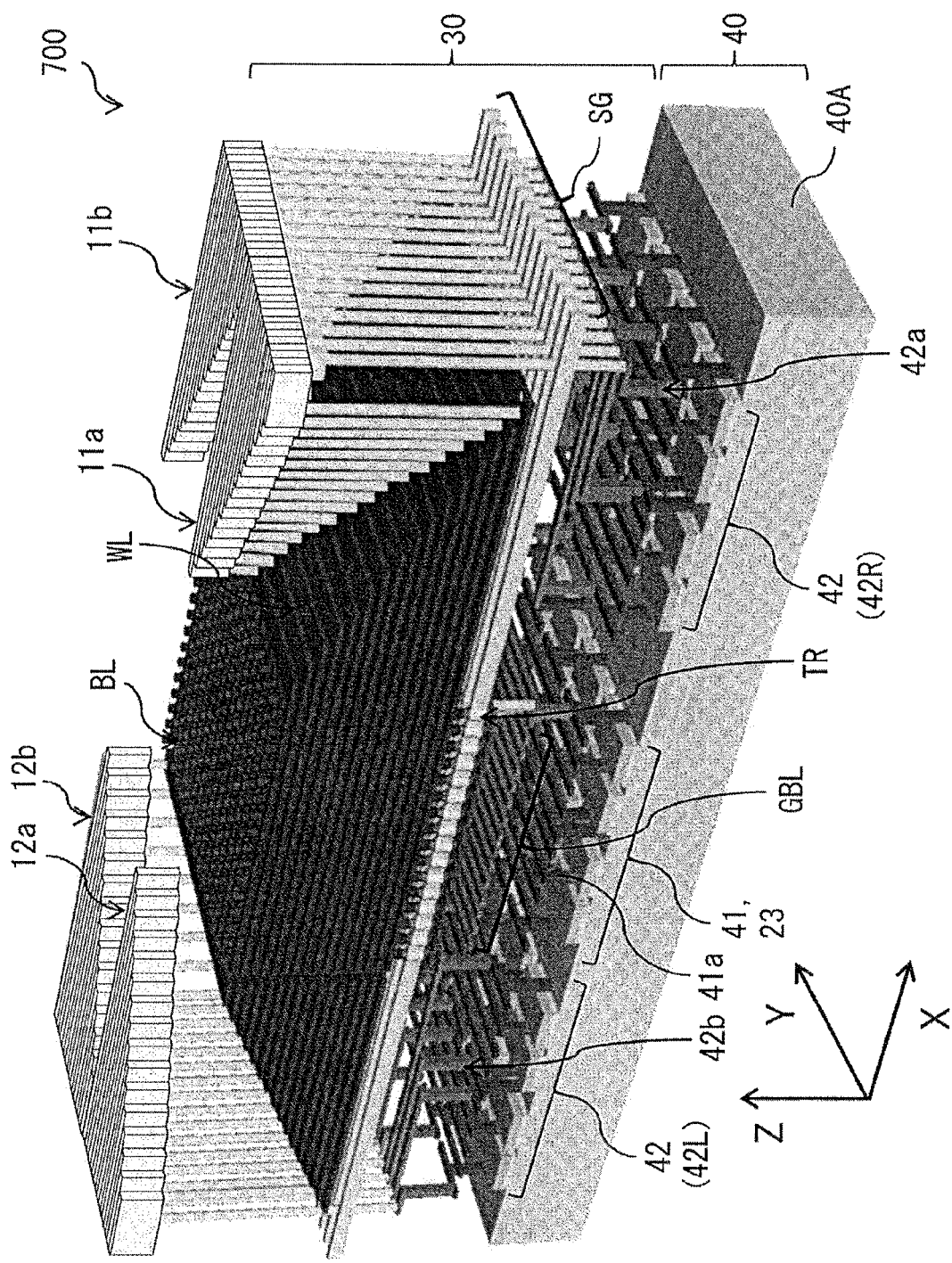
FIG. 15 is a perspective view illustrating a configuration example of a memory cell array illustrated in FIG. 14.
Figure 16:
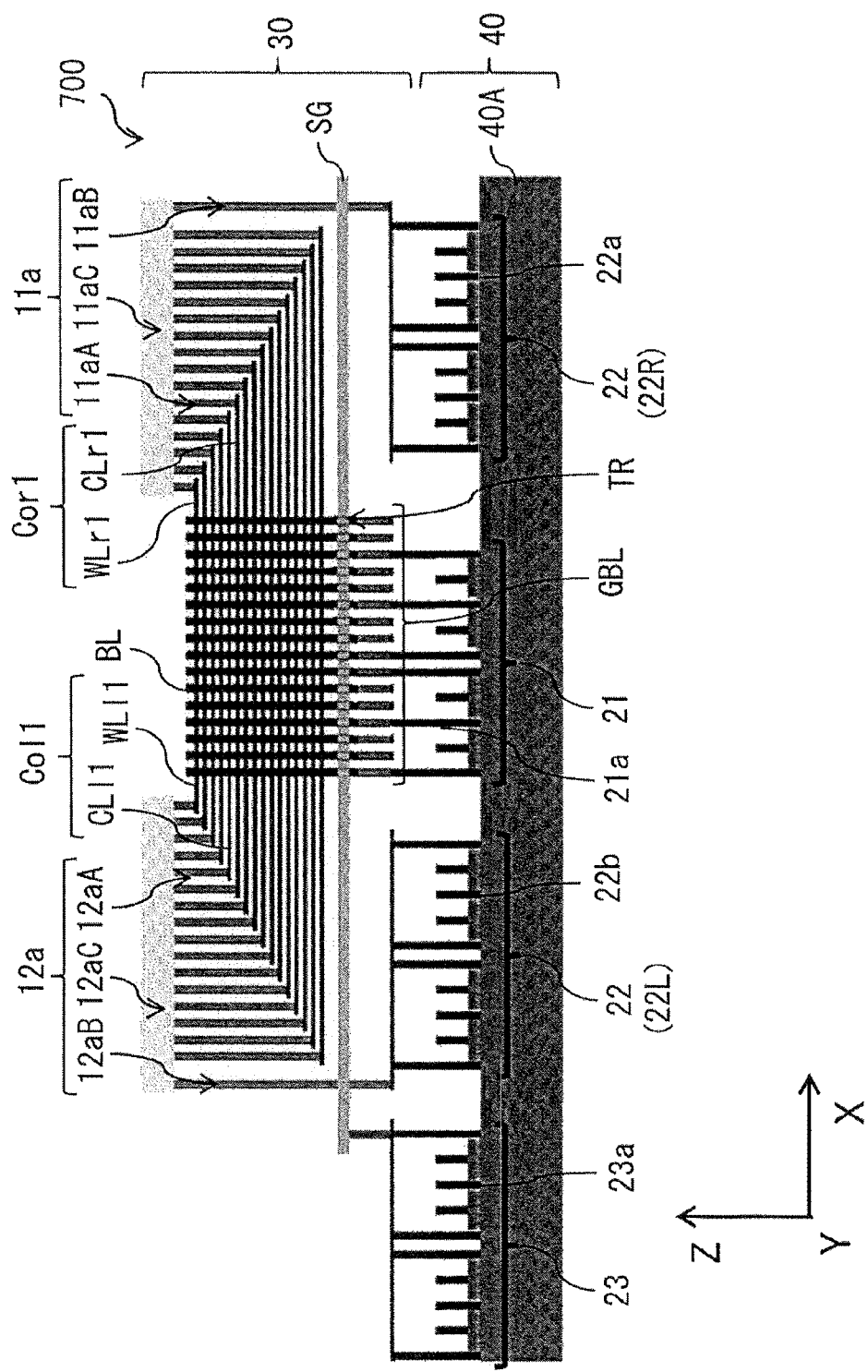
FIG. 16 is a side view illustrating the configuration example of the memory cell array illustrated in FIG. 14.
Figure 17:
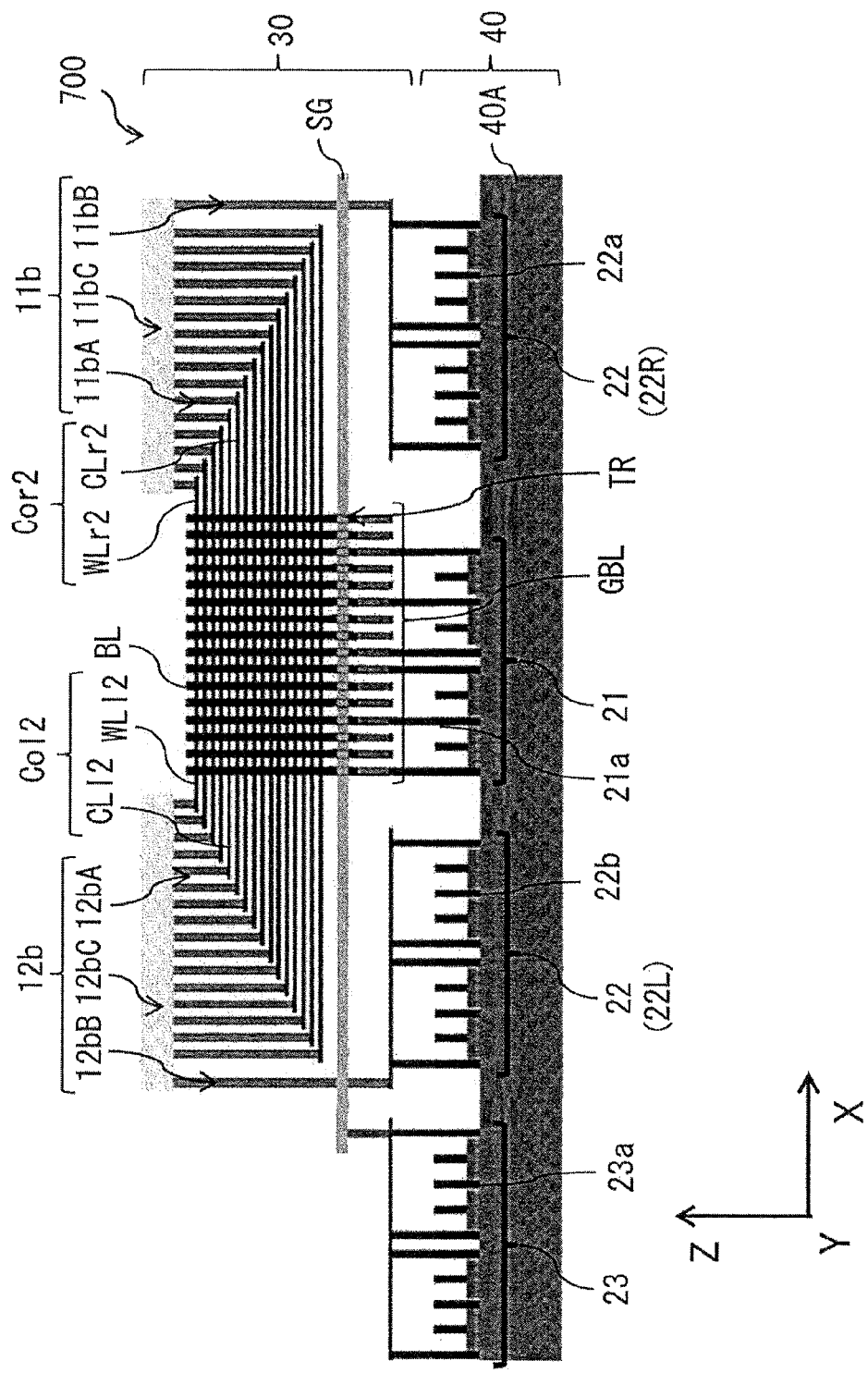
FIG. 17 is a cross-sectional view illustrating the configuration example of the memory cell array illustrated in FIG. 14.
Figure 18:
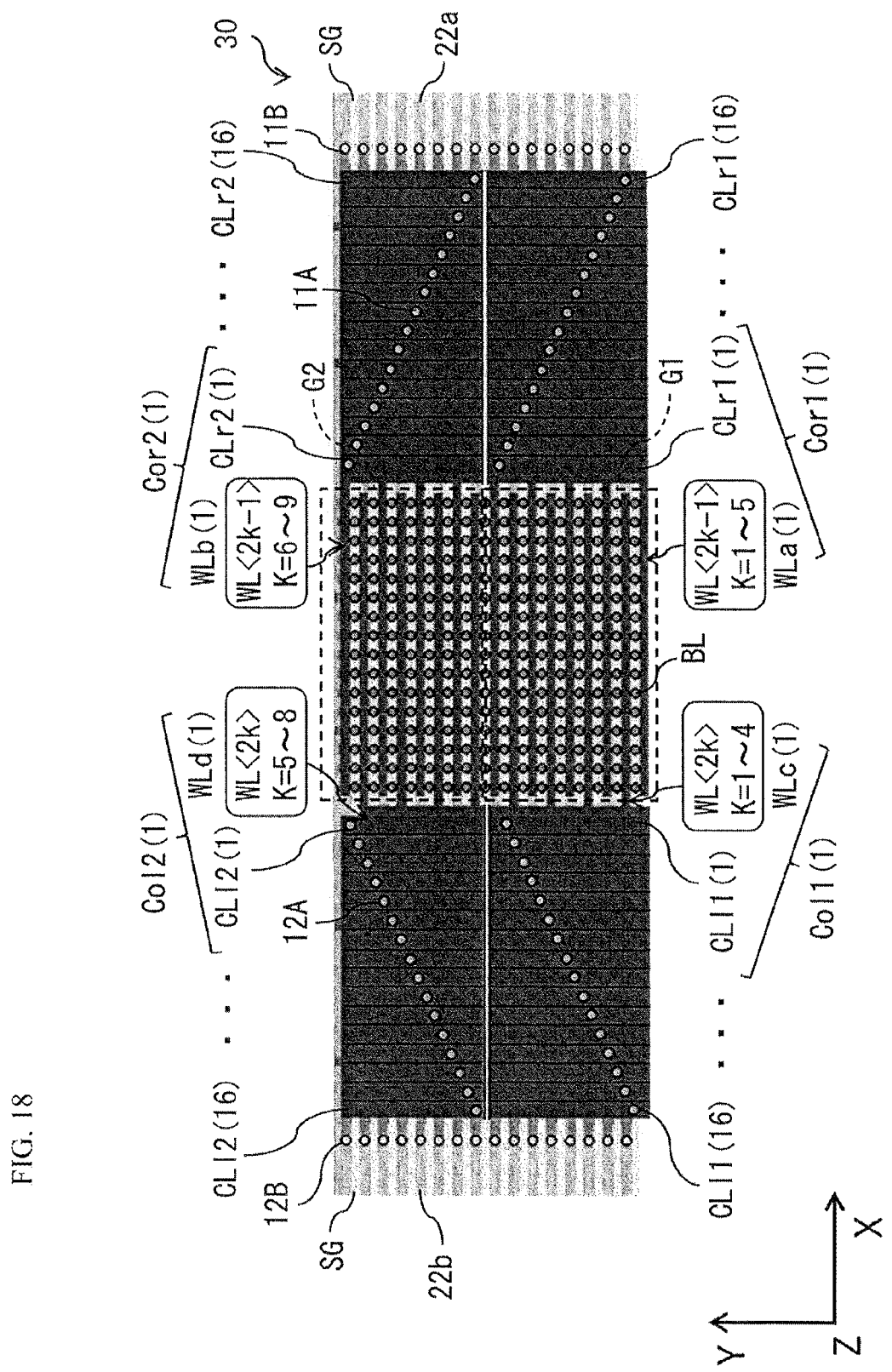
FIG. 18 is a top view illustrating the configuration example of the memory cell array illustrated in FIG. 17.

Subsequently, the memory cell array unit 700 is described. FIG. 14 illustrates an example of a functional block of the memory cell array unit 700. FIG. 15 is a perspective view illustrating a configuration example of the memory cell array unit 700. FIG. 16 is a side view illustrating the configuration example of the memory cell array unit 700. FIG. 17 is a cross-sectional view illustrating the configuration example of the memory cell array unit 700. FIG. 18 is a top view illustrating the configuration example of the memory cell array unit 700. FIG. 17 illustrates an example of a cross section along a boundary between a first group G1 and a second group G2 that are described later.

The memory cell array unit 700 includes, for example, a semiconductor chip. The memory cell array unit 700 includes a memory cell array 30 and a driving circuit 40. The driving circuit 40 exchanges a command, write data, read data, etc. with the memory controller 300. The driving circuit 40 writes data in the memory cell array 30 in accordance with a write command, and reads out data from the memory cell array 30 in accordance with a read command.

(Driving Circuit 40)

The driving circuit 40 is configured to be able to simultaneously select, of multiple SG corresponding to the first group G1 to be described later, one or more SG and, of multiple SG corresponding to the second group G2 to be described later, one or more SG. Specifically, the driving circuit 40 includes a GBL driver 41 (the first driving circuit) that drives the plurality of GBL, a WL driver 42 (the second driving circuit) that drives the plurality of WL, the SG driver 23 (the third driving circuit) that drives the plurality of SG, and a writing latch 43.

The GBL driver 41 selects multiple GBL from the plurality of GBL on the basis of control by the memory controller 300. The GBL driver 41 includes, for example, the multiplexer 21A, the sense amplifier 21B, and a voltage selection circuit 21E. For example, the voltage selection circuit 21E switches and supplies a voltage applied to selected/non-selected GBL depending on the operation mode (readout, writing, etc.) and the value to be written, and determines a voltage to be applied to GBL on the basis of, for example, writing data Wdata inputted from the writing latch 43.

The WL driver 42 applies a predetermined voltage to WL on the basis of control by the memory controller 300. The WL driver 42 includes, for example, the multiplexer 22A and a voltage selection circuit 22C. For example, the voltage selection circuit 22C switches and supplies a voltage applied to selected/non-selected WL depending on the operation mode (readout, writing, etc.) and the value to be written, and determines a voltage to be applied to WL on the basis of, for example, writing data Wdata inputted from the writing latch 43.

The writing latch 43 inputs writing data Wdata to the voltage selection circuits 21E and 22C on the basis of control by the memory controller 300. The writing data Wdata is data regarding a value to be written in multiple memory cells MC to be accessed.

The driving circuit 40 includes a circuit board 40A electrically coupled to the memory cell array 30. The circuit board 40A is provided with the GBL driver 41, the two WL drivers 42, and the SG driver 23. The GBL driver 41 is electrically coupled to BGL through a coupler 41a. The GBL driver 41 is disposed, for example, in a position opposed to GBL. The WL driver 42 (42R) is electrically coupled to couplers CLr1 of WL (WLa) through a coupler 42a and a coupler 11a, and is electrically coupled to couplers CLr2 of WL (WLb) through the coupler 42a and a coupler 11b. The WL driver 42 (42R) is provided, for example, in a position adjacent to the GBL driver 41 in the X-axis direction. The WL driver 42 (42L) is electrically coupled to couplers CLl1 of WL (WLc) through a coupler 42b and a coupler 12a, and is electrically coupled to couplers CLl2 of WL (WLd) through the coupler 42b and a coupler 12b. The WL driver 42 (42L) is provided, for example, in a position adjacent to the GBL driver 41 on the side opposite to the WL driver 42 (42R) in the X-axis direction. The SG driver 23 is electrically coupled to WL through the coupler 23a. The SG driver 23 is provided, for example, in a position adjacent to the WL driver 42 (42R) on the side opposite to the GBL driver 41 in the X-axis direction.

(Memory Cell Array 30)

The memory cell array 30 has a so-called cross-point array structure as with the memory cell array 10 according to the foregoing embodiment, and includes one resistance-varying memory cell MC at each cross-point. The memory cell array 30 corresponds to a modification of the memory cell array 10 according to the foregoing embodiment, where the comb-tooth wiring lines Cor and the comb-tooth wiring lines Col are divided into two in the Y-axis direction. The memory cell array 30 includes two comb-tooth wiring lines Cor1 and Cor2 disposed to be aligned in the Y-axis direction on the right and two comb-tooth wiring lines Col1 and Col2 disposed to be aligned in the Y-axis direction on the left.

Specifically, in each hierarchy level, the plurality of (m) WL disposed to be aligned in the Y-axis direction is divided into the first group G1 including the first to kth multiple WL and the second group G2 including the (k+1)th to mth multiple WL. At this time, even-numbered multiple WL (WLc) belonging to the first group G1 constitute comb teeth of the comb-tooth wiring lines Col1 (third comb-tooth wiring lines) electrically coupled to one another by the left couplers CLl1. Odd-numbered multiple WL (WLa) belonging to the first group G1 constitute comb teeth of the comb-tooth wiring lines Cor1 (fourth comb-tooth wiring lines) electrically coupled to one another by the right couplers CLr1. Even-numbered multiple WL (WLd) belonging to the second group G2 constitute comb teeth of the comb-tooth wiring lines Col2 (fifth comb-tooth wiring lines) electrically coupled to one another by the left couplers CLl2. Odd-numbered multiple WL (WLb) belonging to the second group G2 constitute comb teeth of the comb-tooth wiring lines Cor2 (sixth comb-tooth wiring lines) electrically coupled to one another by the right couplers CLr2.

It is to be noted that FIG. 18 illustrates a case where the even-numbered multiple WL (WLc) belonging to the first group G1 are four WL<2k> (k=1 to 4); likewise, the odd-numbered multiple WL (WLa) belonging to the first group G1 are five WL<2k−1> (k=1 to 5). Also, it illustrates a case where the even-numbered multiple WL (WLd) belonging to the second group G2 are four WL<2k> (k=5 to 8); likewise, the odd-numbered multiple WL (WLb) belonging to the second group G2 are four WL<2k−1> (k=6 to 9).

In the plurality of comb-tooth wiring lines Cor1, respective couplers CLr1, which couple the multiple WL (WLa) to one another, decrease in their length in the X-axis direction with increasing distance from the circuit board 40A; thus, the plurality of couplers CLr1 is disposed in tiers. In the plurality of comb-tooth wiring lines Cor2, respective couplers CLr2, which couple the multiple WL (WLb) to one another, decrease in their length in the X-axis direction with increasing distance from the circuit board 40A; thus, the plurality of couplers CLr2 is disposed in tiers.

In the plurality of comb-tooth wiring lines Col1, respective couplers CLl, which couple the multiple WL (WLc) to one another, decrease in their length in the X-axis direction with increasing distance from the circuit board 40A; thus, the plurality of couplers CLl1 is disposed in tiers. In the plurality of comb-tooth wiring lines Col2, respective couplers CLl2, which couple the multiple WL (WLd) to one another, decrease in their length in the X-axis direction with increasing distance from the circuit board 40A; thus, the plurality of couplers CLl2 is disposed in tiers.

The memory cell array 30 includes the coupler 11a for the comb-tooth wiring lines Cor1 and the coupler 11b for the comb-tooth wiring lines Cor2. The memory cell array 30 further includes the coupler 12a for the comb-tooth wiring lines Col1 and the coupler 12b for the comb-tooth wiring lines Col2.

The coupler 11a includes a plurality of coupling wiring lines 11aA (seventh coupling wiring lines), a plurality of coupling wiring lines 11aB (some of tenth coupling wiring lines), and a plurality of coupling wiring lines 11aC (twelfth coupling wiring lines). The plurality of coupling wiring lines 11aA is electrically coupled to the end edges of the plurality of CLr1 in the X-axis direction, extends in the Z-axis direction, and is disposed to be aligned in a direction intersecting with both the X-axis direction and the Y-axis direction. The plurality of coupling wiring lines 11aB is electrically coupled to the WL driver 22 (22R), extends in the X-axis direction, and is disposed to be aligned in the Y-axis direction. The plurality of coupling wiring lines 11aC extends in the X-axis direction, is disposed to be aligned in the Y-axis direction, and electrically couples the plurality of coupling wiring lines 11aA and the plurality of coupling wiring lines 11aB to each other. In other words, the coupler 11a is formed so that respective wiring lines coupling the plurality of CLr1 to the WL driver 22 (22R) are roughly uniform in length.

The coupler 11b includes a plurality of coupling wiring lines 11bA (ninth coupling wiring lines), a plurality of coupling wiring lines 11bB (some of the tenth coupling wiring lines), and a plurality of coupling wiring lines 11bC (fourteenth coupling wiring lines). The plurality of coupling wiring lines 11bA is electrically coupled to the end edges of the plurality of CLr2 in the X-axis direction, extends in the Z-axis direction, and is disposed to be aligned in a direction intersecting with both the X-axis direction and the Y-axis direction. The plurality of coupling wiring lines 11bB is electrically coupled to the WL driver 22 (22R), extends in the X-axis direction, and is disposed to be aligned in the Y-axis direction. The plurality of coupling wiring lines 11bC extends in the X-axis direction, is disposed to be aligned in the Y-axis direction, and electrically couples the plurality of coupling wiring lines 11bA and the plurality of coupling wiring lines 11bB to each other. In other words, the coupler 11b is formed so that respective wiring lines coupling the plurality of CLr2 to the WL driver 22 (22R) are roughly uniform in length.

The coupler 12a includes a plurality of coupling wiring lines 12aA (sixth coupling wiring lines), a plurality of coupling wiring lines 12aB (some of the tenth coupling wiring lines), and a plurality of coupling wiring lines 12aC (eleventh coupling wiring lines). The plurality of coupling wiring lines 12aA is electrically coupled to the end edges of the plurality of CLl1 in the X-axis direction, extends in the Z-axis direction, and is disposed to be aligned in a direction intersecting with both the X-axis direction and the Y-axis direction. The plurality of coupling wiring lines 12aB is electrically coupled to the WL driver 22 (22L), extends in the X-axis direction, and is disposed to be aligned in the Y-axis direction. The plurality of coupling wiring lines 12aC extends in the X-axis direction, is disposed to be aligned in the Y-axis direction, and electrically couples the plurality of coupling wiring lines 12aA and the plurality of coupling wiring lines 12aB to each other. In other words, the coupler 12a is formed so that respective wiring lines coupling the plurality of CLl1 to the WL driver 22 (22L) are roughly uniform in length.

The coupler 12b includes a plurality of coupling wiring lines 12bA (eighth coupling wiring lines), a plurality of coupling wiring lines 12bB (some of the tenth coupling wiring lines), and a plurality of coupling wiring lines 12bC (thirteenth coupling wiring lines). The plurality of coupling wiring lines 12bA is electrically coupled to the end edges of the plurality of CLl2 in the X-axis direction, extends in the Z-axis direction, and is disposed to be aligned in a direction intersecting with both the X-axis direction and the Y-axis direction. The plurality of coupling wiring lines 12bB is electrically coupled to the WL driver 22 (22L), extends in the X-axis direction, and is disposed to be aligned in the Y-axis direction. The plurality of coupling wiring lines 12bC extends in the X-axis direction, is disposed to be aligned in the Y-axis direction, and electrically couples the plurality of coupling wiring lines 12bA and the plurality of coupling wiring lines 12bB to each other. In other words, the coupler 12b is formed so that respective wiring lines coupling the plurality of CLl2 to the WL driver 22 (22L) are roughly uniform in length.

Figure 19:
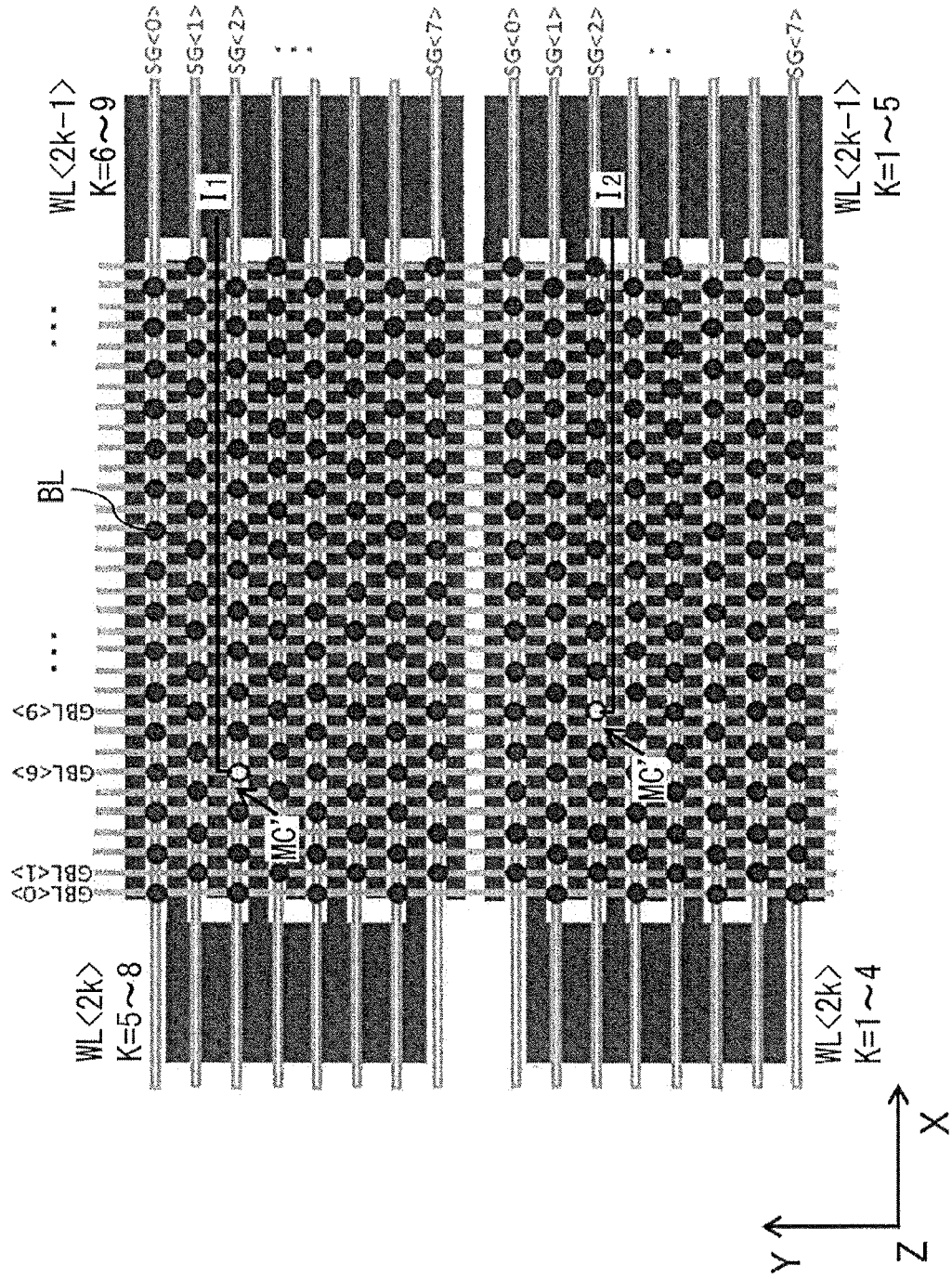
FIG. 19 schematically illustrates an example of a layout of wiring lines of the memory cell array illustrated in FIG. 18.

FIG. 19 schematically illustrates an example of a layout of the wiring lines of the memory cell array 30. It is to be noted that in FIG. 19, for ease of explanation. SG and GBL are disposed on top of WL as a matter of convenience.

The memory cell array 30 is configured, when, of the plurality of memory cells MC, multiple memory cells MC' whose corresponding GBL and WL are different from one another are simultaneously accessed, to allow for simultaneous access to the multiple memory cells MC', without allowing for simultaneous access to memory cells MC corresponding to GBL shared by the memory cells MC'.

Specifically, the pluralities of BL are disposed to be aligned in the X-axis direction at an equal interval of twice the size of the array pitch of the plurality of GBL and in the Y-axis direction at an equal interval of twice the size of the array pitch of the plurality of WL. Furthermore, multiple BL corresponding to two GBL adjacent to each other are disposed to be staggered (i.e., in zigzags) in the XY plane. It is to be noted that the memory cell array 30 is not provided with the couplers SH in the foregoing embodiment.

Thus, by the driving circuit 40) simultaneously selecting two GBL and simultaneously selecting, of the plurality of SG on the side of the comb-tooth wiring lines Cor2 and Col2, one SG and, of the plurality of SG on the side of the comb-tooth wiring lines Cor1 and Col1, one SG, it becomes possible to simultaneously access, of the plurality of memory cells MC, two memory cells MC' whose corresponding GBL and WL are different from each other, and it does not happen that memory cells MC corresponding to GBL shared by the memory cells MC' are simultaneously accessed. For example, when GBL<6> and GBL<9> are selected, and two SG<2> are selected, it is possible to access only a memory cell MC' corresponding to a point at which GBL<6> and one of SG<2> intersect with each other and a memory cell MC' corresponding to a point at which GBL<9> and the other SG<2> intersect with each other. Therefore, it is possible to access the two memory cells MC' without concentrating the access current in one WL.

[Effects]

Subsequently, effects of the memory unit 600 according to the present embodiment are described.

In the memory unit 600 according to the present embodiment, the memory cell array 30 is configured, when, of the plurality of memory cells MC, multiple memory cells MC' whose corresponding GBL and WL are different from one another are simultaneously accessed, to allow for simultaneous access to the multiple memory cells MC', without allowing for simultaneous access to memory cells MC corresponding to GBL shared by the memory cells MC'. Specifically, the pluralities of BL are disposed to be aligned in the X-axis direction at an equal interval of twice the size of the array pitch of the plurality of GBL and in the Y-axis direction at an equal interval of twice the size of the array pitch of the plurality of WL. Furthermore, multiple BL corresponding to two GBL adjacent to each other are disposed to be staggered (i.e., in zigzags) in the XY plane. In addition, the two comb-tooth wiring lines Cor1 and Cor2 disposed to be aligned in the Y-axis direction are provided on the right, and the two comb-tooth wiring lines Col1 and Col2 disposed to be aligned in the Y-axis direction are provided on the left. Thus, it is possible to access multiple memory cells MC' without concentrating the access current in one WL. Consequently, it is possible to suppress a decrease in voltage of WL and achieve a fast access speed.

Furthermore, in the memory unit 600 according to the present embodiment, the driving circuit 40 is configured to be able to simultaneously select, of the multiple SG corresponding to the first group G1, one or more SG and, of the multiple SG corresponding to the second group G2, one or more SG. Thus, it is possible to access multiple memory cells MC' without concentrating the access current in one WL. Consequently, it is possible to suppress a decrease in voltage of WL and achieve a fast access speed.

Moreover, in the memory unit 600 according to the present embodiment, the plurality of couplers CLr1 is disposed in tiers; the plurality of couplers CLl1 is disposed in tiers; the plurality of couplers CLr2 is disposed in tiers; and the plurality of couplers CLl2 is disposed in tiers. Furthermore, the coupler 11a is formed so that the respective wiring lines coupling the plurality of CLr1 to the WL driver 22 (22R) are roughly uniform in length, and the coupler 12a is formed so that the respective wiring lines coupling the plurality of CLl1 to the WL driver 22 (22L) are roughly uniform in length. The coupler 11b is formed so that the respective wiring lines coupling the plurality of CLr2 to the WL driver 22 (22R) are roughly uniform in length, and the coupler 12b is formed so that the respective wiring lines coupling the plurality of CLl2 to the WL driver 22 (22L) are roughly uniform in length. Thus, it is possible to make respective voltage values supplied from the WL drivers 22 to WL uniform, and therefore is possible to suppress variations in the voltage value among WL depending on the distance from the end of WL.

4. Modification Example of Second Embodiment

Subsequently, a modification example of the memory cell array 30 according to the second embodiment is described. In the memory cell array 30 according to the second embodiment, of the plurality of SG on the side of the comb-tooth wiring lines Cor2 and Col2, multiple SG and, of the plurality of SG on the side of the comb-tooth wiring lines Cor1 and Col1, multiple SG may be simultaneously selected. For example, the driving circuit 40 simultaneously selects four GBL, and simultaneously selects, of the plurality of SG on the side of the comb-tooth wiring lines Cor2 and Col2, two SG and, of the plurality of SG on the side of the comb-tooth wiring lines Cor1 and Col1, two SG. This makes it possible to simultaneously access, of the plurality of memory cells MC, two memory cells MC' whose corresponding GBL and WL are different from each other on the side of the comb-tooth wiring lines Cor2 and Col2. Furthermore, it is possible to simultaneously access, of the plurality of memory cells MC, two memory cells MC' whose corresponding GBL and WL are different from each other on the side of the comb-tooth wiring lines Cor1 and Col1. At this time, it does not happen that memory cells MC corresponding to GBL shared by the memory cells MC' are simultaneously accessed. Therefore, it is possible to access the four memory cells MC' without concentrating the access current in one WL. Consequently, it is possible to suppress a decrease in voltage of WL and achieve a fast access speed.

5. Third Embodiment

[Configuration]

Figure 20:
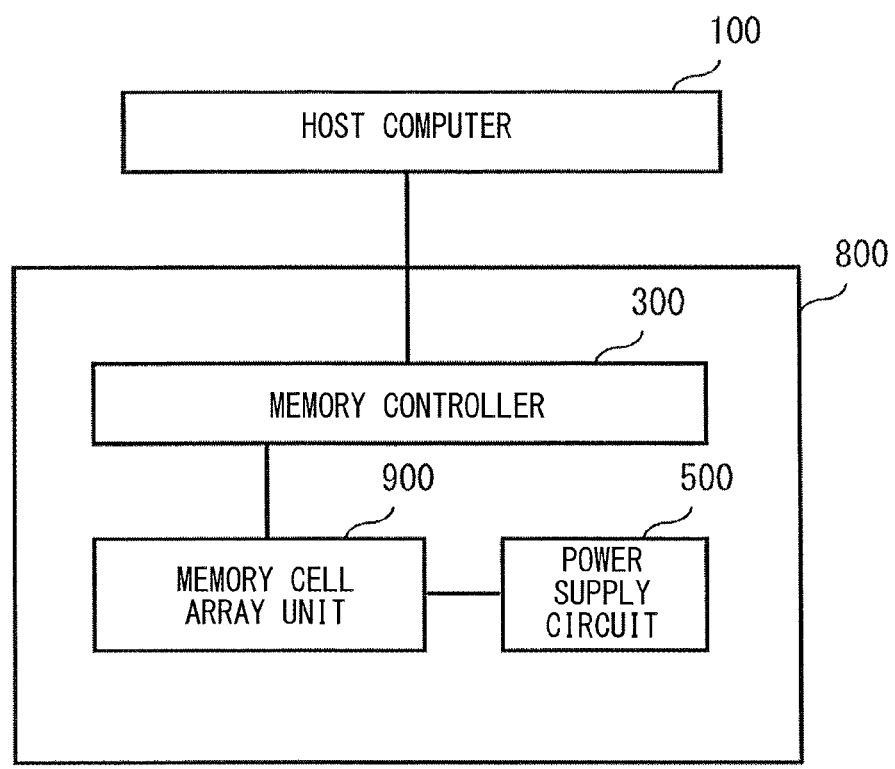
FIG. 20 illustrates a schematic configuration example of a memory unit according to a third embodiment of the present disclosure.

FIG. 20 illustrates an example of a functional block of an information processing system according to a third embodiment. This information processing system includes the host computer 100 and a memory unit 800. The memory unit 800 includes the memory controller 300, a memory cell array unit 900, and the power supply circuit 500.

The host computer 100 controls the memory unit 800. The memory controller 300 controls the memory cell array unit 900. The power supply circuit 500 supplies a desired voltage to the memory cell array unit 900.

Figure 21:
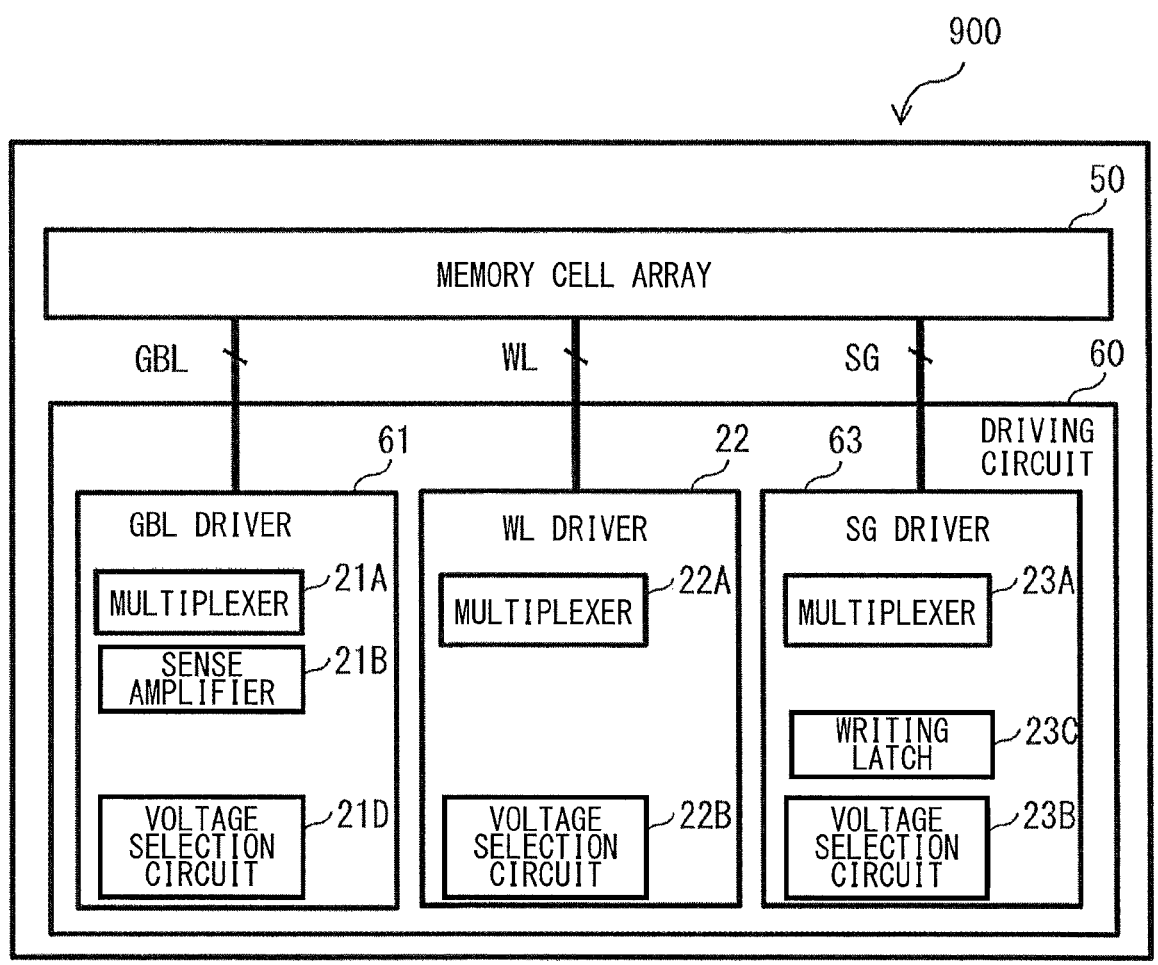
FIG. 21 illustrates a schematic configuration example of a memory cell array unit illustrated in FIG. 20.

Subsequently, the memory cell array unit 900 is described. FIG. 21 illustrates an example of a functional block of the memory cell array unit 900. The memory cell array unit 900 includes, for example, a semiconductor chip. The memory cell array unit 900 includes a memory cell array 50 and a driving circuit 60. The driving circuit 60 exchanges a command, write data, read data, etc. with the memory controller 300. The driving circuit 60 writes data in the memory cell array 50 in accordance with a write command, and reads out data from the memory cell array 50 in accordance with a read command.

The driving circuit 60 is configured to be able to simultaneously access, of the plurality of memory cells MC, multiple memory cells MC whose corresponding GBL is shared by one another and corresponding WL is different from one another. Specifically, the driving circuit 60 includes a GBL driver 61 that drives the plurality of GBL, the WL driver 22 that drives the plurality of WL, and an SG driver 63 that drives the plurality of SG.

The GBL driver 61 selects multiple GBL from the plurality of GBL on the basis of control by the memory controller 300. The GBL driver 61 includes, for example, the multiplexer 21A, the sense amplifier 21B, and the voltage selection circuit 21D. The SG driver 63 selects multiple SG from the plurality of SG on the basis of control by the memory controller 300. The SG driver 63 includes, for example, the multiplexer 23A, the voltage selection circuit 23B, and a writing latch 23C. The writing latch 23C temporarily stores therein a value to be written in a memory cell MC. The voltage selection circuit 23B switches and supplies a voltage applied to selected/non-selected SG depending on the operation mode (readout, writing, etc.) and the value to be written, and determines a voltage to be applied to SG on the basis of, for example, writing data Wdata inputted from the writing latch 23C.

Figure 22:
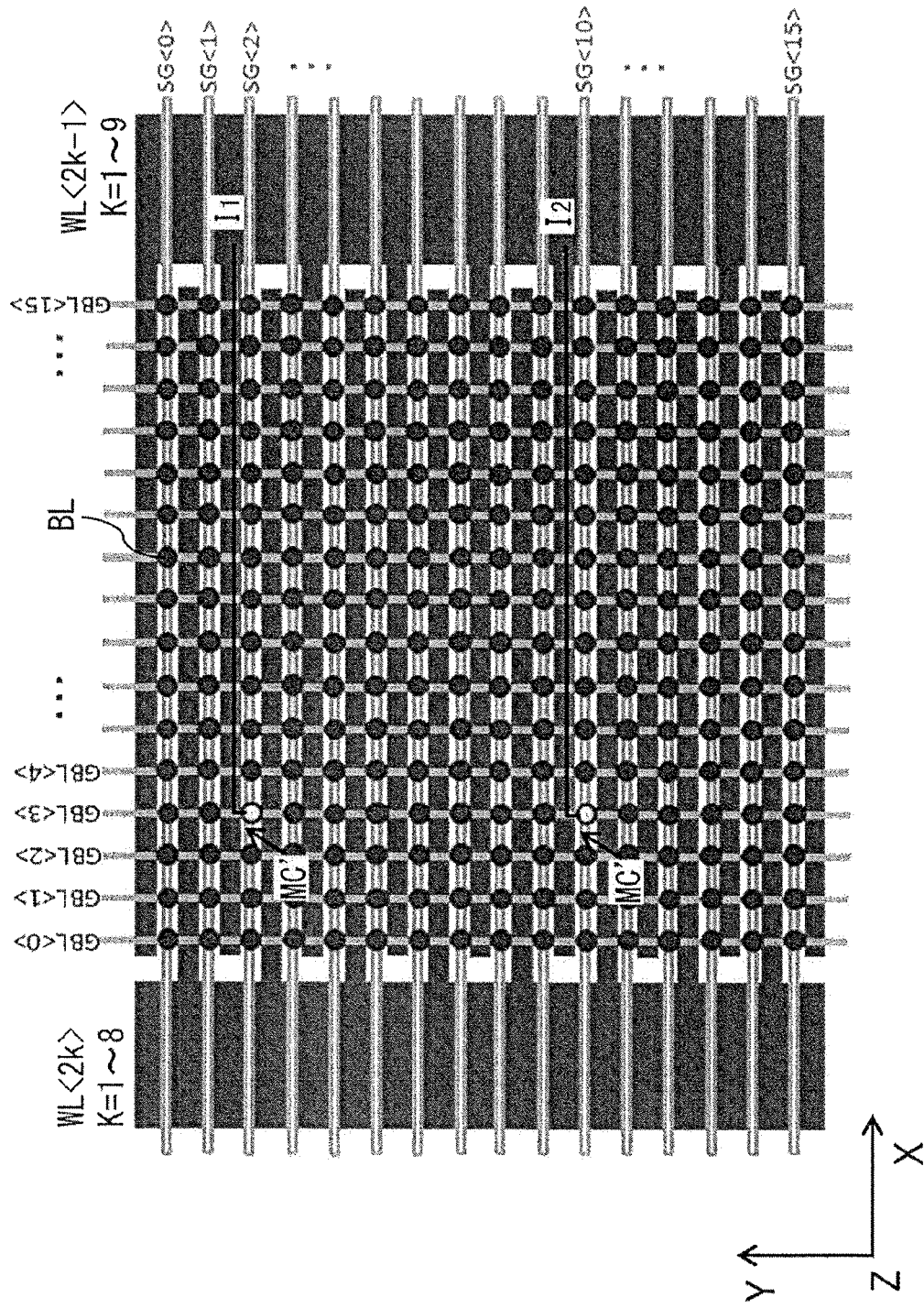
FIG. 22 schematically illustrates an example of a layout of wiring lines of a memory cell array illustrated in FIG. 21.

FIG. 22 schematically illustrates an example of a layout of wiring lines of the memory cell array 50. It is to be noted that in FIG. 22, for ease of explanation, SG and GBL are disposed on top of WL as a matter of convenience. The memory cell array 50 corresponds to a modification of the memory cell array 10 according to the first embodiment, where the disposition of BL is different. Specifically, the pluralities of BL are disposed to be aligned in the X-axis direction at an equal pitch to the array pitch of the plurality of GBL and in the Y-axis direction at an equal pitch to the array pitch of the plurality of WL.

[Effects]

Subsequently, effects of the memory unit 800 according to the present embodiment are described.

In the memory unit 800 according to the present embodiment, the pluralities of BL are disposed to be aligned in the X-axis direction at an equal pitch to the array pitch of the plurality of GBL and in the Y-axis direction at an equal pitch to the array pitch of the plurality of WL. Furthermore, of the plurality of memory cells MC, multiple memory cells MC whose corresponding GBL is shared by one another and corresponding WL is different from one another are simultaneously accessed by the driving circuit 60. Thus, it is possible to access multiple memory cells MC' without concentrating the access current in one WL. Consequently, it is possible to suppress a decrease in voltage of WL and achieve a fast access speed.

In the memory unit 800 according to the present embodiment, it is possible to reduce the number of wiring lines of GBL and the number of transistors TR as compared with the memory units 200 and 600 according to the foregoing embodiments; therefore, it is possible to reduce the circuit scale of the memory unit 800.

6. Fourth Embodiment

[Configuration]

Figure 23:
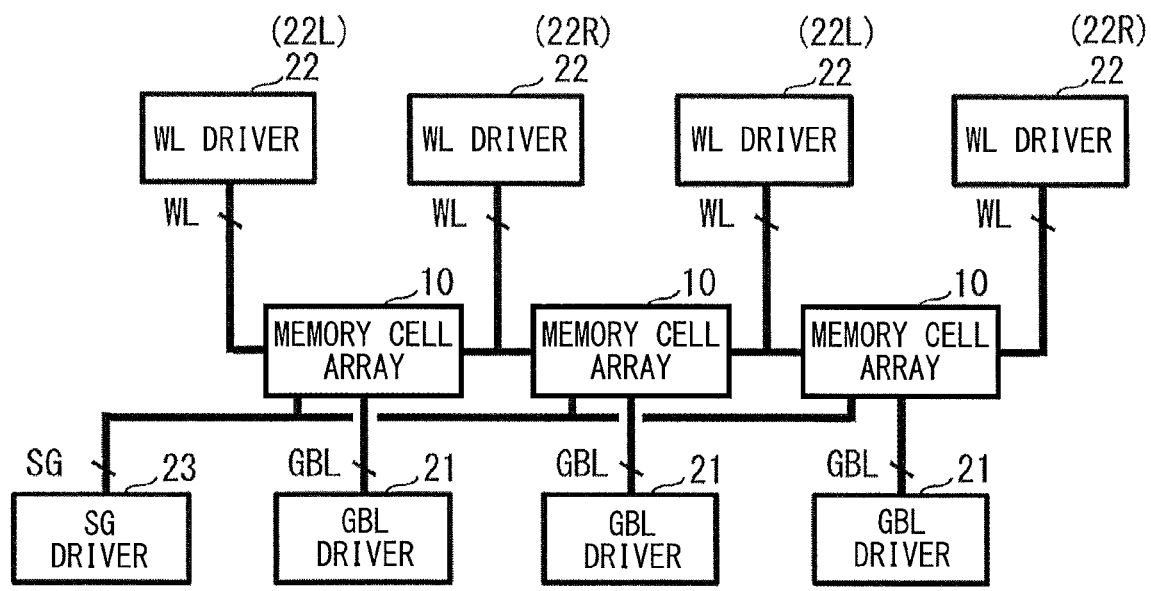
FIG. 23 illustrates a schematic configuration example of a memory cell array unit in a memory unit including a plurality of memory cell arrays illustrated in FIGS. 2, 10, 11, or 12.
Figure 24:
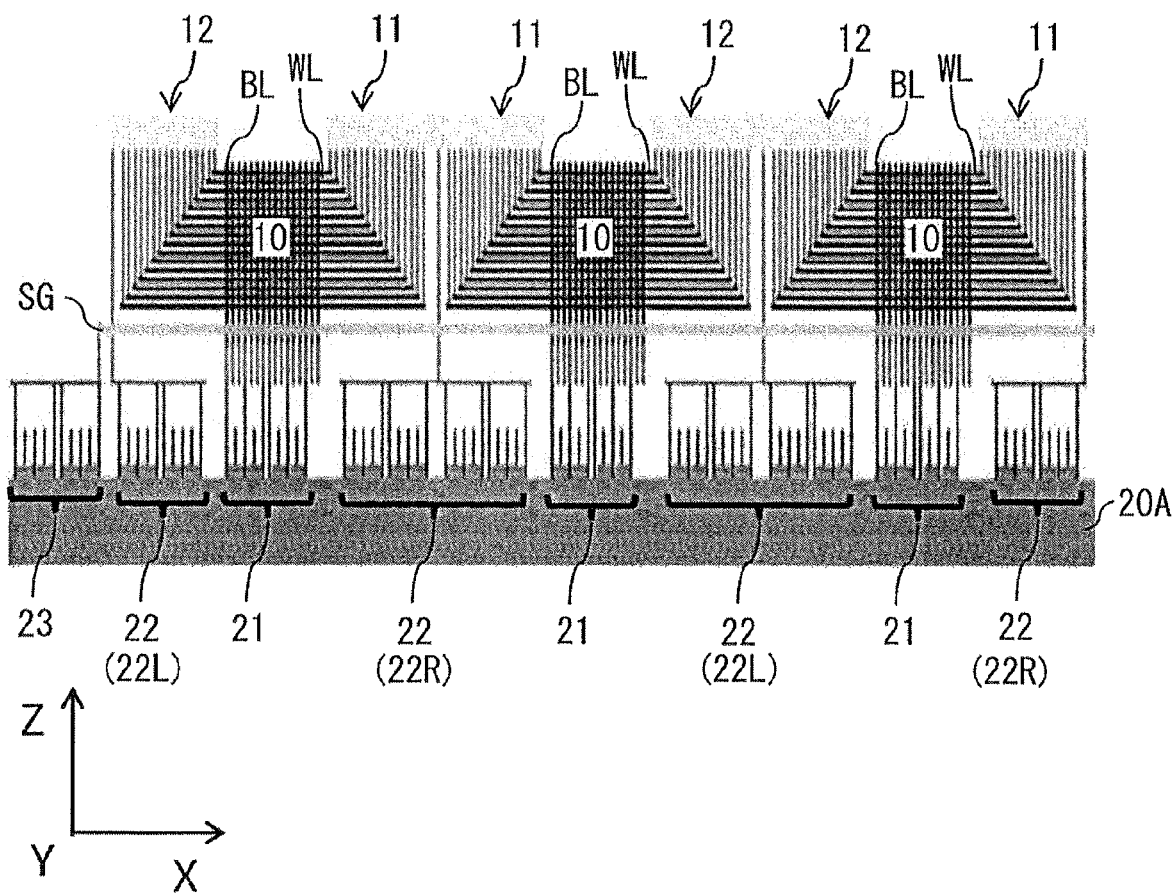
FIG. 24 is a side view illustrating a configuration example of the memory unit illustrated in FIG. 23.

FIG. 23 illustrates an example of a functional block of a memory cell array in an information processing system according to a fourth embodiment. FIG. 24 is a cross-sectional view illustrating a configuration example of the memory cell array according to the present embodiment. The memory cell array according to the present embodiment includes a plurality of memory cell arrays 10 disposed to be aligned in the X-axis direction. The plurality of memory cell arrays 10 is disposed so that coupling lines 11 are adjacent to each other, and coupling lines 12 are adjacent to each other.

The driving circuit 20 that accesses the plurality of memory cell arrays 10 includes a plurality of GBL drivers 21; one GBL driver 21 is provided for each memory cell array 10. The driving circuit 20 further includes the WL driver 22 that drives multiple WL coupled to respective coupling lines 11 of two memory cell arrays 10 of which the coupling lines 11 are adjacent to each other and the WL driver 22 that drives multiple WL coupled to respective coupling lines 12 of two memory cell arrays 10 of which the coupling lines 12 are adjacent to each other. The driving circuit 20 further includes the WL driver 22 that drives multiple WL coupled to the coupling line 12 of, of the plurality of memory cell arrays 10 aligned in a row, the memory cell array 10 disposed at one end and the WL driver 22 that drives multiple WL coupled to the coupling line 11 of, of the plurality of memory cell arrays 10 aligned in a row, the memory cell array 10 disposed at the other end. The driving circuit 20 further includes the SG driver 23 that drives the plurality of SG included in all the memory cell arrays 20.

Here, the GBL drivers 21 are each disposed in a position opposed to the plurality of GBL included in the corresponding memory cell array 10. The WL drivers 22 are each disposed in a position adjacent to the GBL driver 21 in the X-axis direction. The SG driver 23 is disposed, for example, in a position adjacent to the WL driver 22 on the side opposite to the GBL driver 21 in the X-axis direction. The plurality of memory cell arrays 10 and the driving circuit 20 are disposed in this way, which makes it possible to reduce the circuit area as compared with a case where they are disposed aimlessly.

Figure 25:
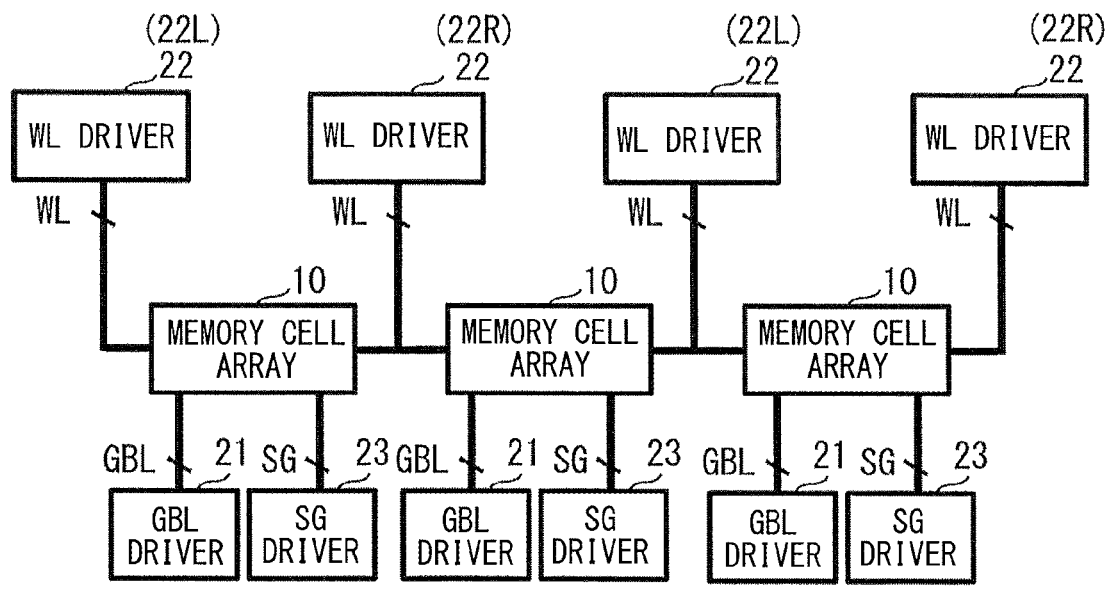
FIG. 25 illustrates a schematic configuration example of a memory cell array unit in a memory unit including a plurality of memory cell arrays illustrated in FIG. 22.
Figure 26:
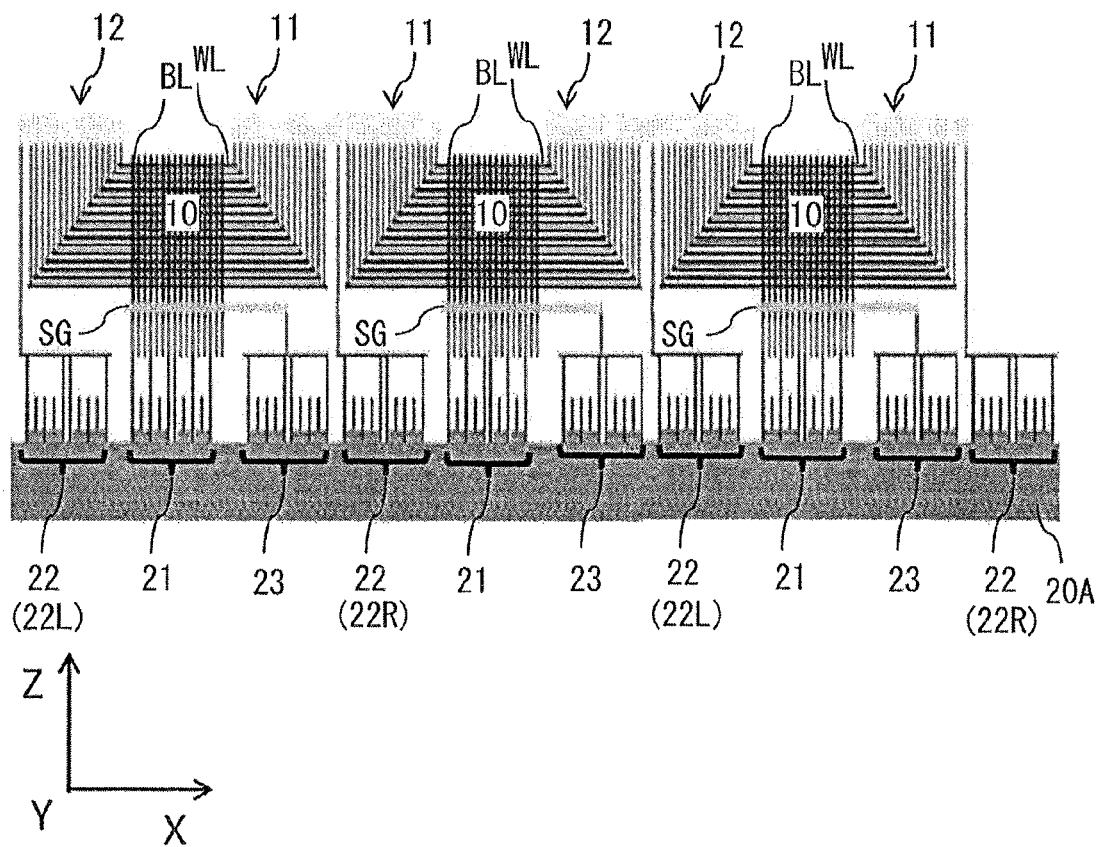
FIG. 26 is a side view illustrating a configuration example of the memory unit illustrated in FIG. 25.

It is to be noted that as illustrated in FIGS. 25 and 26, a plurality of SG drivers 23 may be provided in a manner of one SG driver 23 for each memory cell array 10. At this time, each of the SG drivers 23 is disposed, for example, in a position that is adjacent to the GBL driver 21 in the X-axis direction and is adjacent on the side opposite to the GBL driver 21 in the X-axis direction. Even in a case of such a disposition, it is possible to reduce the circuit area as compared with a case where they are disposed aimlessly.

The present technology is described above with some embodiments and their modification examples; however, the present disclosure is not limited to the foregoing embodiments, etc. and may be modified in a variety of ways. It is to be noted that the effects described in the present specification are just examples. The effects of the present disclosure are not limited to those described in the present specification. The present disclosure may have another effect besides those described in the present specification.

Furthermore, for example, the present disclosure may have the following configurations.

(1)
A memory unit including:
a memory cell array; and
a driving circuit that accesses the memory cell array,
the memory cell array including
pluralities of first wiring lines that extend in a first direction, and are disposed to be aligned in a second direction orthogonal to the first direction and in a third direction orthogonal to the first direction and the second direction,
a plurality of second wiring lines that extends in the first direction, and is disposed to be aligned in the second direction,
pluralities of third wiring lines that extend in the third direction, and are disposed to be aligned in the first direction and in the second direction, and are also disposed to go through a gap between two first wiring lines adjacent to each other in the second direction when viewed from the third direction,
a plurality of resistance-varying memory cells, one memory cell being provided at each of respective points at which the third wiring lines and the first wiring lines are opposed to each other,
a plurality of transistors each having a gate coupled to the corresponding second wiring line, one transistor being provided for each of the third wiring lines, and
a plurality of fourth wiring lines that extends in the second direction, and is disposed to be aligned in the first direction, one fourth wiring line being provided for multiple third wiring lines disposed to be aligned in the second direction, and each of the fourth wiring lines being coupled to the corresponding multiple third wiring lines through the transistors,
in which when, of the plurality of memory cells, multiple first memory cells whose corresponding fourth wiring line and first wiring line are different from one another are simultaneously accessed, the memory cell array allows for simultaneous access to the multiple first memory cells, without allowing for simultaneous access to memory cells corresponding to the fourth wiring lines shared by the first memory cells.

(2)

The memory unit according to (1), in which the pluralities of third wiring lines are disposed to be aligned in the first direction at an equal interval of a times (a is an integer of 2 or greater) a size of an array pitch of the plurality of fourth wiring lines and in the second direction at an equal interval of n times a size of an array pitch of the plurality of first wiring lines.

(3)

The memory unit according to (1) or (2), in which of the plurality of first wiring lines disposed to be aligned in the second direction, even-numbered multiple first wiring lines are electrically coupled to one another, and constitute comb teeth of first comb-tooth wiring lines, and of the plurality of first wiring lines disposed to be aligned in the second direction, odd-numbered multiple first wiring lines are electrically coupled to one another, and constitute comb teeth of second comb-tooth wiring lines.

(4)

The memory unit according to (1) or (2), in which the plurality of first wiring lines disposed to be aligned in the second direction is divided into a first group including first to kth multiple first wiring lines and a second group including (k+1)th to mth multiple first wiring lines, even-numbered multiple first wiring lines belonging to the first group constitute comb teeth of third comb-tooth wiring lines electrically coupled to one another, odd-numbered multiple first wiring lines belonging to the first group constitute comb teeth of fourth comb-tooth wiring lines electrically coupled to one another, even-numbered multiple first wiring lines belonging to the second group constitute comb teeth of fifth comb-tooth wiring lines electrically coupled to one another, and odd-numbered multiple first wiring lines belonging to the second group constitute comb teeth of sixth comb-tooth wiring lines electrically coupled to one another.

(5)

The memory unit according to any one of (1) to (3), in which the memory cell array further includes a plurality of couplers that electrically couples, of the plurality of second wiring lines, multiple second wiring lines not adjacent to one another.

(6)

The memory unit according to any one of (1) to (3), in which the driving circuit simultaneously selects, of the plurality of second wiring lines, multiple second wiring lines not adjacent to one another.

(7)

The memory unit according to (4), in which the driving circuit simultaneously selects, of multiple second wiring lines corresponding to the first group, one or more second wiring lines and, of multiple second wiring lines corresponding to the second group, one or more second wiring lines.

(8)

The memory unit according to any one of (1) to (3), further including a circuit board that includes the driving circuit and is electrically coupled to the memory cell array, in which in a plurality of the first comb-tooth wiring lines, respective first couplers, which couple multiple first wiring lines to one another, decrease in their length in the first direction with increasing distance from the circuit board, and thus a plurality of the first couplers is disposed in tiers, in a plurality of the second comb-tooth wiring lines, respective second couplers, which couple multiple first wiring lines to one another, decrease in their length in the first direction with increasing distance from the circuit board, and thus a plurality of the second couplers is disposed in tiers, and the memory cell array includes:
  a plurality of first coupling wiring lines that is electrically coupled to end edges of the plurality of first couplers in the first direction, extends in the third direction, and is disposed to be aligned in a direction intersecting with the first direction and the second direction;
  a plurality of second coupling wiring lines that is electrically coupled to end edges of the plurality of second couplers in the first direction, extends in the third direction, and is disposed to be aligned in a direction intersecting with the first direction and the second direction;
  a plurality of third coupling wiring lines that is electrically coupled to the driving circuit, extends in the third direction, and is disposed to be aligned in the second direction;
  a plurality of fourth coupling wiring lines that electrically couples the plurality of first coupling wiring lines and some of the plurality of third coupling wiring lines to each other; and
  a plurality of fifth coupling wiring lines that electrically couples the plurality of second coupling wiring lines and some of the plurality of third coupling wiring lines to each other.

(9)

The memory unit according to (4), further including a circuit board that includes the driving circuit and is electrically coupled to the memory cell array, in which in a plurality of the third comb-tooth wiring lines, respective third couplers, which couple multiple first wiring lines to one another, decrease in their length in the first direction with increasing distance from the circuit board, and thus a plurality of the third couplers is disposed in tiers, in a plurality of the fourth comb-tooth wiring lines, respective fourth couplers, which couple multiple first wiring lines to one another, decrease in their length in the first direction with increasing distance from the circuit board, and thus a plurality of the fourth couplers is disposed in tiers, in a plurality of the fifth comb-tooth wiring lines, respective fifth couplers, which couple multiple first wiring lines to one another, decrease in their length in the first direction with increasing distance from the circuit board, and thus a plurality of the fifth couplers is disposed in tiers, in a plurality of the sixth comb-tooth wiring lines, respective sixth couplers, which couple multiple first wiring lines to one another, decrease in their length in the first direction with increasing distance from the circuit board, and thus a plurality of the sixth couplers is disposed in tiers, and the memory cell array includes:
  a plurality of sixth coupling wiring lines that is electrically coupled to end edges of the plurality of third couplers in the first direction, extends in the third direction, and is disposed to be aligned in a direction intersecting with the first direction and the second direction.
  a plurality of seventh coupling wiring lines that is electrically coupled to end edges of the plurality of fourth couplers in the first direction, extends in the third direction, and is disposed to be aligned in a direction intersecting with the first direction and the second direction;
  a plurality of eighth coupling wiring lines that is electrically coupled to end edges of the plurality of fifth couplers in the first direction, extends in the third direction, and is disposed to be aligned in a direction intersecting with the first direction and the second direction;

a plurality of ninth coupling wiring lines that is electrically coupled to end edges of the plurality of sixth couplers in the first direction, extends in the third direction, and is disposed to be aligned in a direction intersecting with the first direction and the second direction;

a plurality of tenth coupling wiring lines that is electrically coupled to the driving circuit, extends in the third direction, and is disposed to be aligned in the second direction;

a plurality of eleventh coupling wiring lines that electrically couples the plurality of sixth coupling wiring lines and some of the plurality of tenth coupling wiring lines to each other;

a plurality of twelfth coupling wiring lines that electrically couples the plurality of seventh coupling wiring lines and some of the plurality of tenth coupling wiring lines to each other;

a plurality of thirteenth coupling wiring lines that electrically couples the plurality of eighth coupling wiring lines and some of the plurality of tenth coupling wiring lines to each other; and a plurality of fourteenth coupling wiring lines that electrically couples the plurality of ninth coupling wiring lines and some of the plurality of tenth coupling wiring lines to each other.

(10)

The memory unit according to any one of (1) to (3), including a plurality of the memory cell arrays disposed to be aligned in the first direction, in which the driving circuit includes:

a controller that controls access to the plurality of memory cell arrays;

a first driving circuit that selects multiple fourth wiring lines from the plurality of fourth wiring lines included in a first memory cell array that is one of the plurality of memory cell arrays on a basis of control by the controller;

a second driving circuit that simultaneously selects multiple first wiring lines from the plurality of first wiring lines included in the first memory cell array and multiple first wiring lines from the plurality of first wiring lines included in, of the plurality of memory cell arrays, a second memory cell array adjacent to the first memory cell array on a basis of control by the controller; and a third driving circuit that simultaneously selects multiple second wiring lines from the plurality of second wiring lines included in the first memory cell array and multiple second wiring lines from the plurality of second wiring lines included in the second memory cell array on a basis of control by the controller, the first driving circuit is provided in a position opposed to the plurality of fourth wiring lines included in the first memory cell array, and the second driving circuit is provided in a position adjacent to the first driving circuit in the first direction.

(11)

A memory unit including:
a memory cell array; and
a driving circuit that accesses the memory cell array,
the memory cell array including
pluralities of first wiring lines that extend in a first direction, and are disposed to be aligned in a second direction orthogonal to the first direction and in a third direction orthogonal to the first direction and the second direction, a plurality of second wiring lines that extends in the first direction, and is disposed to be aligned in the second direction, pluralities of third wiring lines that extend in the third direction, and are disposed to be aligned in the first direction and in the second direction, and are also disposed to go through a gap between two first wiring lines adjacent to each other in the second direction when viewed from the third direction, a plurality of resistance-varying memory cells, one memory cell being provided at each of respective points at which the third wiring lines and the first wiring lines are opposed to each other, a plurality of transistors each having a gate coupled to the corresponding second wiring line, one transistor being provided for each of the third wiring lines, and a plurality of fourth wiring lines that extends in the second direction, and is disposed to be aligned in the first direction, one fourth wiring line being provided for multiple third wiring lines disposed to be aligned in the second direction, and each of the fourth wiring lines being coupled to the corresponding multiple third wiring lines through the transistors, in which the driving circuit simultaneously accesses, of the plurality of memory cells, multiple first memory cells whose corresponding fourth wiring line is shared by one another and corresponding first wiring line is different from one another.

(12)

The memory unit according to (11), in which the pluralities of third wiring lines are disposed to be aligned in the first direction at an equal pitch to an array pitch of the plurality of fourth wiring lines and in the second direction at an equal pitch to an array pitch of the plurality of first wiring lines.

This application claims the benefit of Japanese Priority Patent Application JP2017-071718 filed with the Japan Patent Office on Mar. 31, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A memory unit comprising:
a memory cell array; and
a driving circuit that accesses the memory cell array,
the memory cell array including
pluralities of first wiring lines that extend in a first direction, and are disposed to be aligned in a second direction orthogonal to the first direction and in a third direction orthogonal to the first direction and the second direction, a plurality of second wiring lines that extends in the first direction, and is disposed to be aligned in the second direction, pluralities of third wiring lines that extend in the third direction, and are disposed to be aligned in the first direction and in the second direction, and are also disposed to go through a gap between two first wiring lines adjacent to each other in the second direction when viewed from the third direction, a plurality of resistance-varying memory cells, one memory cell being provided at each of respective points at which the third wiring lines and the first wiring lines are opposed to each other, a plurality of transistors each having a gate coupled to the corresponding second wiring line, one transistor being provided for each of the third wiring lines, and a plurality of fourth wiring lines that extends in the second direction, and is disposed to be aligned in the first direction, one fourth wiring line being provided for multiple third wiring lines disposed to be aligned in the second direction, and each of the fourth wiring lines being coupled to the corresponding multiple third wiring lines through the transistors, wherein when, of the plurality of memory cells, multiple first memory cells whose corresponding fourth wiring line and first wiring line are different from one another are simultaneously accessed, the memory cell array allows for simultaneous access to the multiple first memory cells, without allowing for simultaneous access to memory cells corresponding to the fourth wiring lines shared by the first memory cells.

2. The memory unit according to claim 1, wherein the pluralities of third wiring lines are disposed to be aligned in the first direction at an equal interval of n times (n is an integer of 2 or greater) a size of an array pitch of the plurality of fourth wiring lines and in the second direction at an equal interval of n times a size of an array pitch of the plurality of first wiring lines.

3. The memory unit according to claim 2, wherein
of the plurality of first wiring lines disposed to be aligned in the second direction, even-numbered multiple first wiring lines are electrically coupled to one another, and constitute comb teeth of first comb-tooth wiring lines, and
of the plurality of first wiring lines disposed to be aligned in the second direction, odd-numbered multiple first wiring lines are electrically coupled to one another, and constitute comb teeth of second comb-tooth wiring lines.

4. The memory unit according to claim 3, wherein the memory cell array further includes a plurality of couplers that electrically couples, of the plurality of second wiring lines, multiple second wiring lines not adjacent to one another.

5. The memory unit according to claim 3, wherein the driving circuit simultaneously selects, of the plurality of second wiring lines, multiple second wiring lines not adjacent to one another.

6. The memory unit according to claim 3, further comprising a circuit board that includes the driving circuit and is electrically coupled to the memory cell array,
wherein in a plurality of the first comb-tooth wiring lines, respective first couplers, which couple multiple first wiring lines to one another, decrease in their length in the first direction with increasing distance from the circuit board, and thus a plurality of the first couplers is disposed in tiers,
in a plurality of the second comb-tooth wiring lines, respective second couplers, which couple multiple first wiring lines to one another, decrease in their length in the first direction with increasing distance from the circuit board, and thus a plurality of the second couplers is disposed in tiers, and
the memory cell array includes:
a plurality of first coupling wiring lines that is electrically coupled to end edges of the plurality of first couplers in the first direction, extends in the third direction, and is disposed to be aligned in a direction intersecting with the first direction and the second direction;

a plurality of second coupling wiring lines that is electrically coupled to end edges of the plurality of second couplers in the first direction, extends in the third direction, and is disposed to be aligned in a direction intersecting with the first direction and the second direction;

a plurality of third coupling wiring lines that is electrically coupled to the driving circuit, extends in the third direction, and is disposed to be aligned in the second direction;

a plurality of fourth coupling wiring lines that electrically couples the plurality of first coupling wiring lines and some of the plurality of third coupling wiring lines to each other; and a plurality of fifth coupling wiring lines that electrically couples the plurality of second coupling wiring lines and some of the plurality of third coupling wiring lines to each other.

7. The memory unit according to claim 3, comprising a plurality of the memory cell arrays disposed to be aligned in the first direction,
wherein the driving circuit includes:
a controller that controls access to the plurality of memory cell arrays;
a first driving circuit that drives the plurality of fourth wiring lines included in a first memory cell array that is one of the plurality of memory cell arrays on a basis of control by the controller;
a second driving circuit that drives the plurality of first wiring lines included in the first memory cell array and the plurality of first wiring lines included in, of the plurality of memory cell arrays, a second memory cell array adjacent to the first memory cell array on a basis of control by the controller; and
a third driving circuit that drives the plurality of second wiring lines included in the first memory cell array and the plurality of second wiring lines included in the second memory cell array on a basis of control by the controller,
the first driving circuit is provided in a position opposed to the plurality of fourth wiring lines included in the first memory cell array, and
the second driving circuit is provided in a position adjacent to the first driving circuit in the first direction.

8. The memory unit according to claim 2, wherein
the plurality of first wiring lines disposed to be aligned in the second direction is divided into a first group including first to kth multiple first wiring lines and a second group including (k+1)th to mth multiple first wiring lines,
even-numbered multiple first wiring lines belonging to the first group constitute comb teeth of third comb-tooth wiring lines electrically coupled to one another,
odd-numbered multiple first wiring lines belonging to the first group constitute comb teeth of fourth comb-tooth wiring lines electrically coupled to one another,
even-numbered multiple first wiring lines belonging to the second group constitute comb teeth of fifth comb-tooth wiring lines electrically coupled to one another, and
odd-numbered multiple first wiring lines belonging to the second group constitute comb teeth of sixth comb-tooth wiring lines electrically coupled to one another.

9. The memory unit according to claim 8, wherein the driving circuit simultaneously selects, of multiple second wiring lines corresponding to the first group, one or more second wiring lines and, of multiple second wiring lines corresponding to the second group, one or more second wiring lines.

10. The memory unit according to claim 8, further comprising a circuit board that includes the driving circuit and is electrically coupled to the memory cell array,
wherein in a plurality of the third comb-tooth wiring lines, respective third couplers, which couple multiple first wiring lines to one another, decrease in their length in the first direction with increasing distance from the circuit board, and thus a plurality of the third couplers is disposed in tiers,
in a plurality of the fourth comb-tooth wiring lines, respective fourth couplers, which couple multiple first wiring lines to one another, decrease in their length in the first direction with increasing distance from the circuit board, and thus a plurality of the fourth couplers is disposed in tiers,
in a plurality of the fifth comb-tooth wiring lines, respective fifth couplers, which couple multiple first wiring lines to one another, decrease in their length in the first direction with increasing distance from the circuit board, and thus a plurality of the fifth couplers is disposed in tiers,
in a plurality of the sixth comb-tooth wiring lines, respective sixth couplers, which couple multiple first wiring lines to one another, decrease in their length in the first direction with increasing distance from the circuit board, and thus a plurality of the sixth couplers is disposed in tiers, and
the memory cell array includes:
a plurality of sixth coupling wiring lines that is electrically coupled to end edges of the plurality of third couplers in the first direction, extends in the third direction, and is disposed to be aligned in a direction intersecting with the first direction and the second direction;
a plurality of seventh coupling wiring lines that is electrically coupled to end edges of the plurality of fourth couplers in the first direction, extends in the third direction, and is disposed to be aligned in a direction intersecting with the first direction and the second direction;
a plurality of eighth coupling wiring lines that is electrically coupled to end edges of the plurality of fifth couplers in the first direction, extends in the third direction, and is disposed to be aligned in a direction intersecting with the first direction and the second direction;
a plurality of ninth coupling wiring lines that is electrically coupled to end edges of the plurality of sixth couplers in the first direction, extends in the third direction, and is disposed to be aligned in a direction intersecting with the first direction and the second direction;
a plurality of tenth coupling wiring lines that is electrically coupled to the driving circuit, extends in the third direction, and is disposed to be aligned in the second direction;
a plurality of eleventh coupling wiring lines that electrically couples the plurality of sixth coupling wiring lines and some of the plurality of tenth coupling wiring lines to each other;
a plurality of twelfth coupling wiring lines that electrically couples the plurality of seventh coupling wiring lines and some of the plurality of tenth coupling wiring lines to each other;
a plurality of thirteenth coupling wiring lines that electrically couples the plurality of eighth coupling wiring lines and some of the plurality of tenth coupling wiring lines to each other; and
a plurality of fourteenth coupling wiring lines that electrically couples the plurality of ninth coupling wiring lines and some of the plurality of tenth coupling wiring lines to each other.

11. A memory unit comprising:
a memory cell array; and
a driving circuit that accesses the memory cell array,
the memory cell array including
pluralities of first wiring lines that extend in a first direction, and are disposed to be aligned in a second direction orthogonal to the first direction and in a third direction orthogonal to the first direction and the second direction,
a plurality of second wiring lines that extends in the first direction, and is disposed to be aligned in the second direction,
pluralities of third wiring lines that extend in the third direction, and are disposed to be aligned in the first direction and in the second direction, and are also disposed to go through a gap between two first wiring lines adjacent to each other in the second direction when viewed from the third direction,
a plurality of resistance-varying memory cells, one memory cell being provided at each of respective points at which the third wiring lines and the first wiring lines are opposed to each other,
a plurality of transistors each having a gate coupled to the corresponding second wiring line, one transistor being provided for each of the third wiring lines, and
a plurality of fourth wiring lines that extends in the second direction, and is disposed to be aligned in the first direction, one fourth wiring line being provided for multiple third wiring lines disposed to be aligned in the second direction, and each of the fourth wiring lines being coupled to the corresponding multiple third wiring lines through the transistors,
wherein the driving circuit simultaneously accesses, of the plurality of memory cells, multiple first memory cells whose corresponding fourth wiring line is shared by one another and corresponding first wiring line is different from one another.

12. The memory unit according to claim 11, wherein the pluralities of third wiring lines are disposed to be aligned in the first direction at an equal pitch to an array pitch of the plurality of fourth wiring lines and in the second direction at an equal pitch to an array pitch of the plurality of first wiring lines.

* * * * *